US012751029B2

(12) United States Patent
Lan et al.

(10) Patent No.: US 12,751,029 B2
(45) Date of Patent: Sep. 29, 2026

(54) STRUCTURE AND FORMATION METHOD OF SEMICONDUCTOR DEVICE WITH POWER RAIL

(71) Applicant: Taiwan Semiconductor Manufacturing Company, Ltd., Hsinchu (TW)

(72) Inventors: Wen-Ting Lan, Hsinchu City (TW); Lin-Yu Huang, Hsinchu (TW); Shi-Ning Ju, Hsinchu City (TW); Kuo-Cheng Chiang, Zhubei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 747 days.

(21) Appl. No.: 17/864,894

(22) Filed: Jul. 14, 2022

(65) Prior Publication Data

US 2024/0021708 A1 Jan. 18, 2024

(51) Int. Cl.

| | |
|---|---|
| ***H10D 30/01*** | (2025.01) |
| ***H10D 30/62*** | (2025.01) |
| ***H10D 30/67*** | (2025.01) |
| ***H10D 84/01*** | (2026.01) |
| ***H10D 84/03*** | (2025.01) |
| ***H10W 20/20*** | (2026.01) |

(52) U.S. Cl.

CPC ....... *H10D 30/024* (2025.01); *H10D 30/6211* (2025.01); *H10D 30/6735* (2025.01); *H10D 84/0147* (2025.01); *H10D 84/0158* (2025.01); *H10D 84/038* (2025.01); *H10W 20/20* (2026.01)

(58) Field of Classification Search

CPC ............. H10D 30/024; H10D 30/6211; H10D 84/0147; H10D 84/0158; H10D 30/6735; H10D 84/038

See application file for complete search history.

(56) References Cited

U.S. PATENT DOCUMENTS

| | | | | |
|---|---|---|---|---|
| 2020/0135634 A1* | 4/2020 | Chiang | ................ | H10D 64/251 |
| 2020/0373331 A1* | 11/2020 | Kim | ...................... | H10D 86/201 |
| 2022/0223698 A1* | 7/2022 | Xie | .................... | H10D 30/6729 |
| 2023/0178433 A1* | 6/2023 | Xie | ....................... | H01L 23/535 257/621 |
| 2023/0402378 A1* | 12/2023 | Mukesh | ............ | H01L 23/53295 |

* cited by examiner

*Primary Examiner* — Christine A Enad

(74) *Attorney, Agent, or Firm* — Birch, Stewart, Kolasch & Birch, LLP

(57) ABSTRACT

A semiconductor device structure and a formation method are provided. The method includes forming a first fin structure and a second fin structure over a substrate. The method also includes partially removing the substrate to form a trench between the first fin structure and the second fin structure and forming a sacrificial structure to fill the trench. The method further includes forming an epitaxial structure on the first fin structure and forming a conductive contact over the epitaxial structure and the sacrificial structure. In addition, the method includes replacing the sacrificial structure with a conductive structure.

20 Claims, 32 Drawing Sheets

STRUCTURE AND FORMATION METHOD OF SEMICONDUCTOR DEVICE WITH POWER RAIL

BACKGROUND

The semiconductor integrated circuit (IC) industry has experienced rapid growth. Technological advances in IC materials and design have produced generations of ICs. Each generation has smaller and more complex circuits than the previous generation.

Over the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
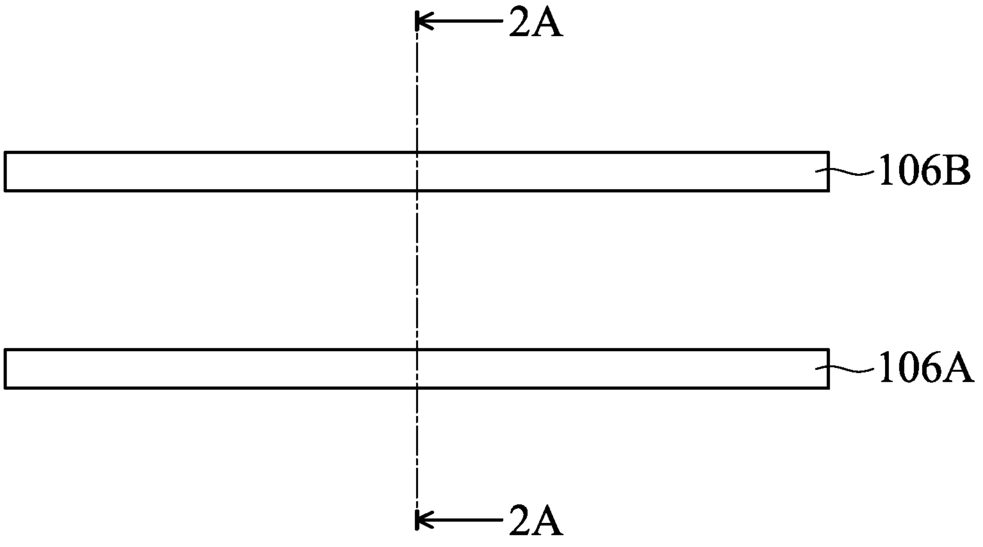
FIGS. 1A-1B are top views of various stages of a process for forming a portion of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below." "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the disclosure may relate to FinFET structure having fins and/or gate all around (GAA) transistor structures (which include channel layers suspended over a substrate, where the channel layers are fabricated from semiconductor layers stacks (i.e., fins)). The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 2A:
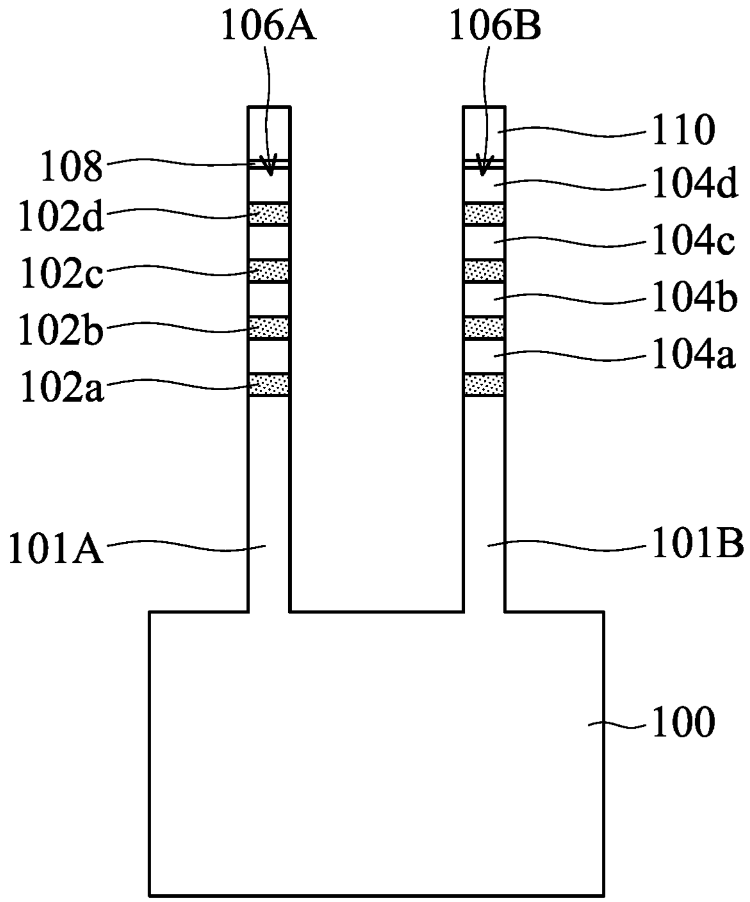
FIGS. 2A-2T are cross-sectional views of various stages of a process for forming a portion of a semiconductor device structure, in accordance with some embodiments.
Figure 2B:
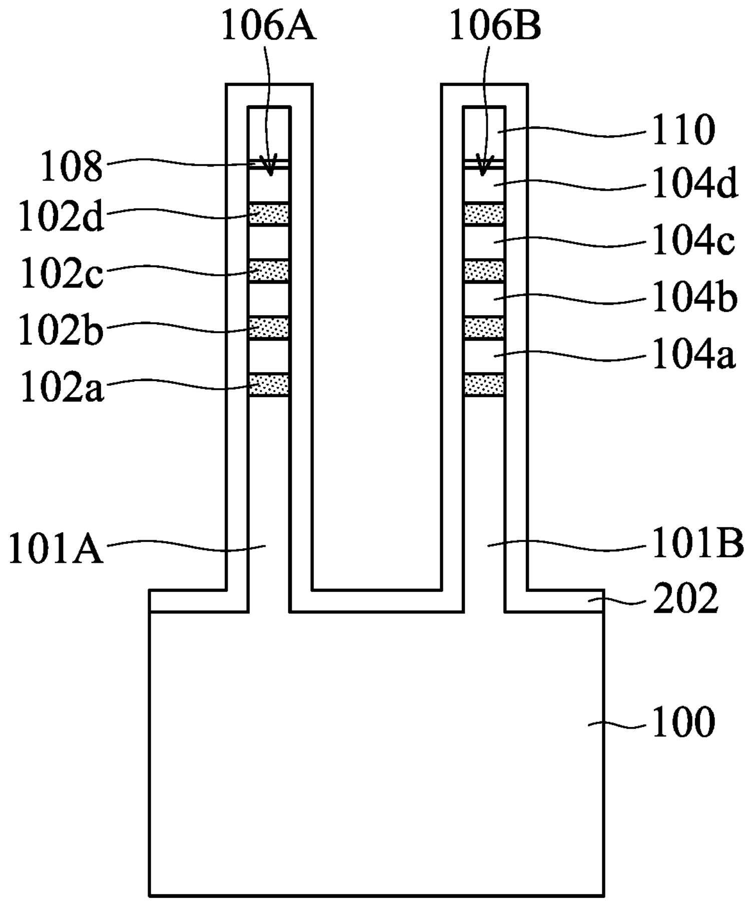
Figure 2C:
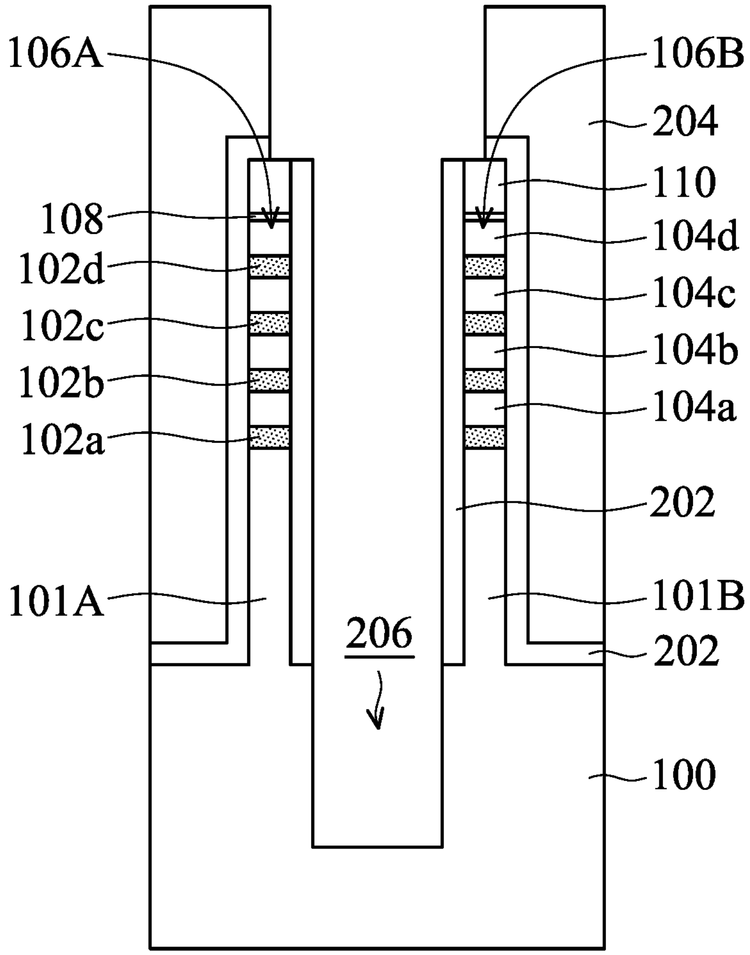
Figure 2D:
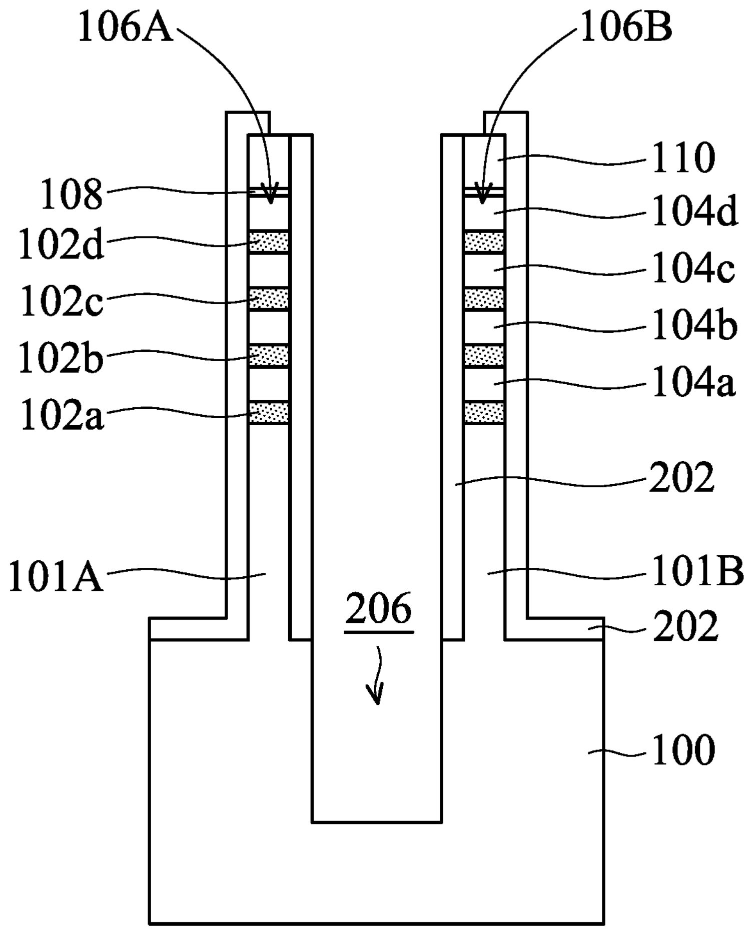
Figure 2E:
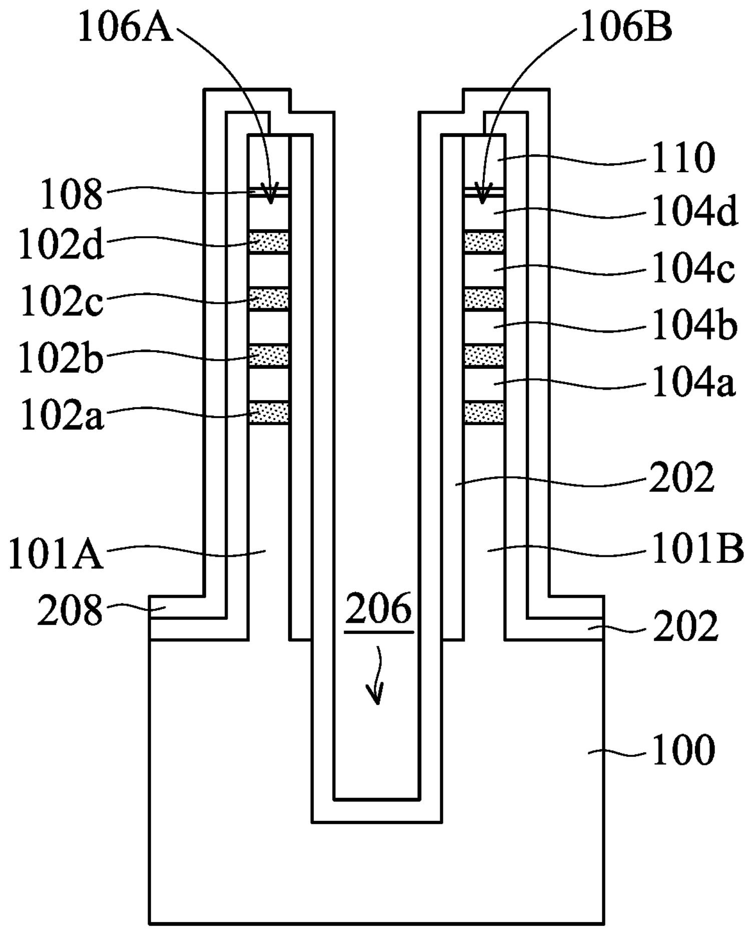
Figure 2F:
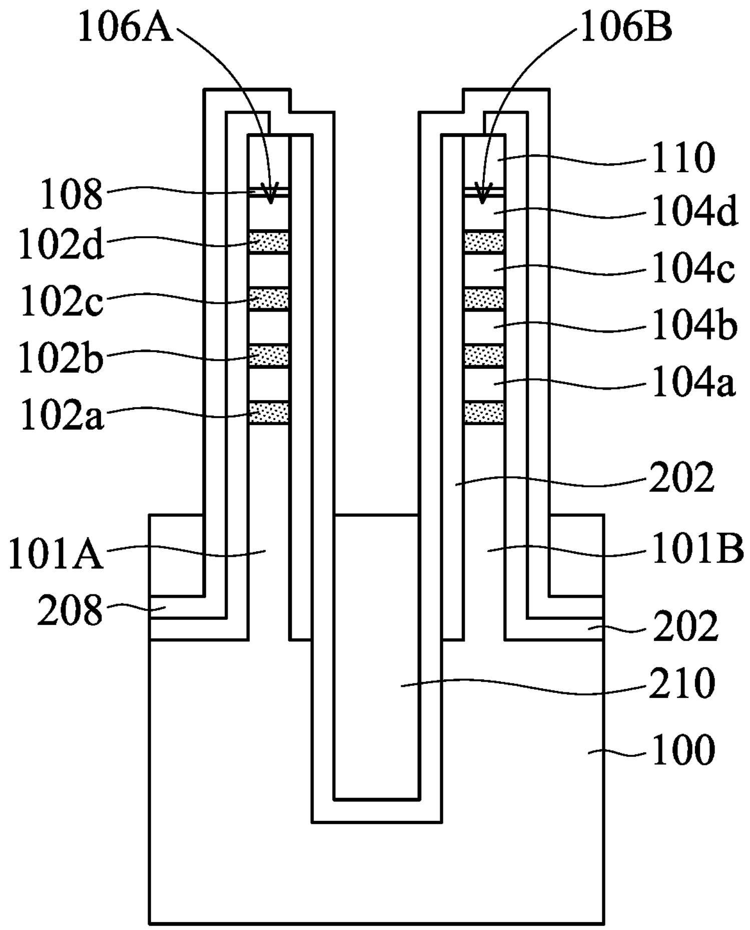
Figure 2G:
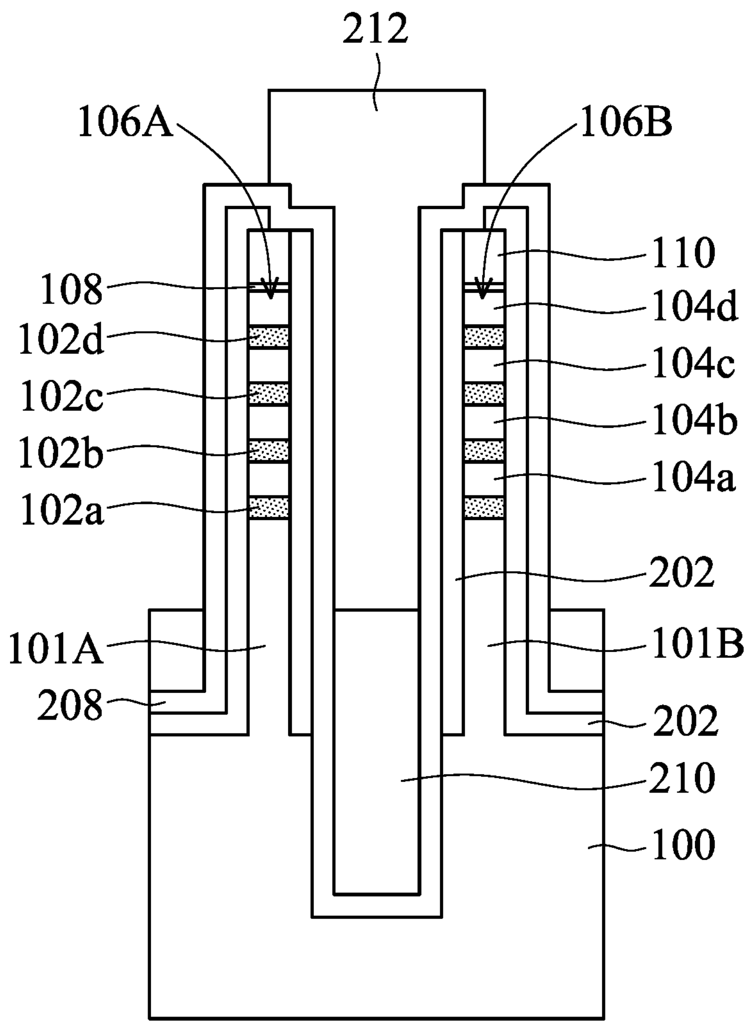
Figure 2H:
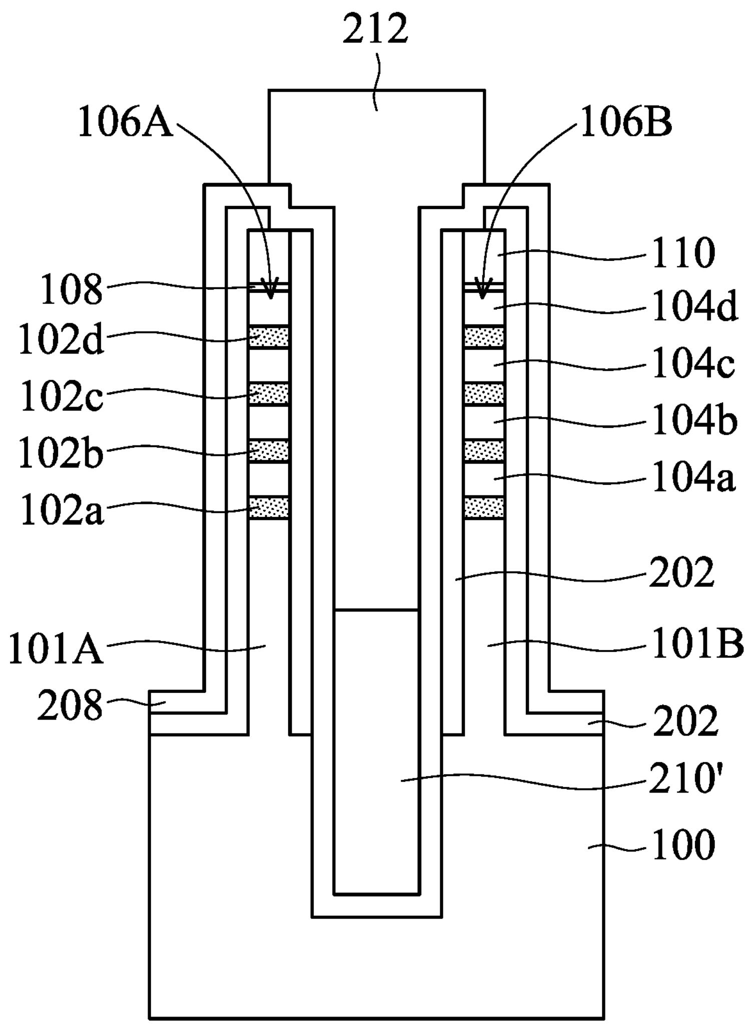
Figure 2I:
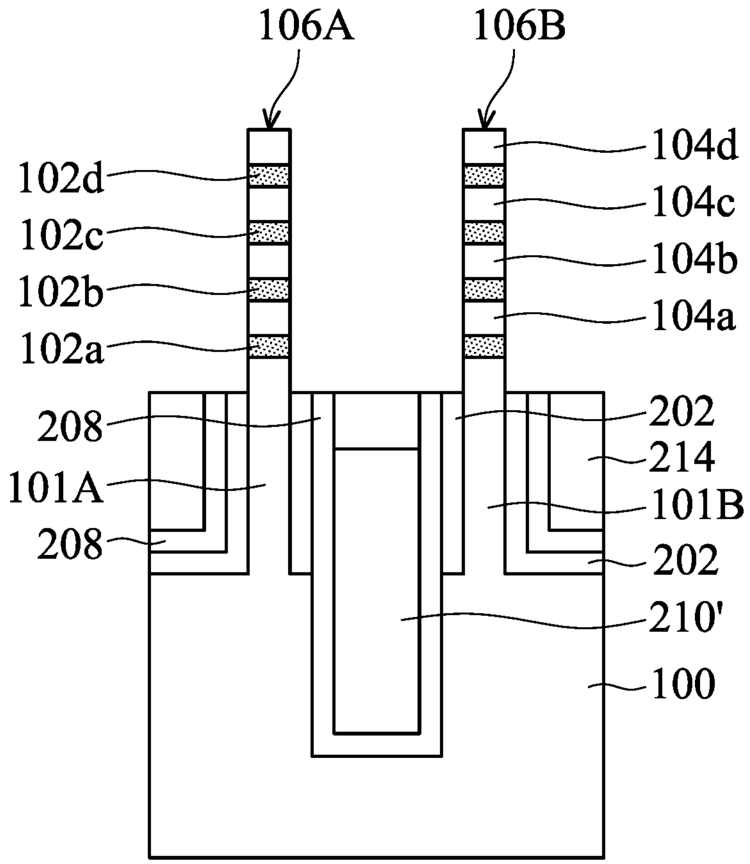
Figure 2J:
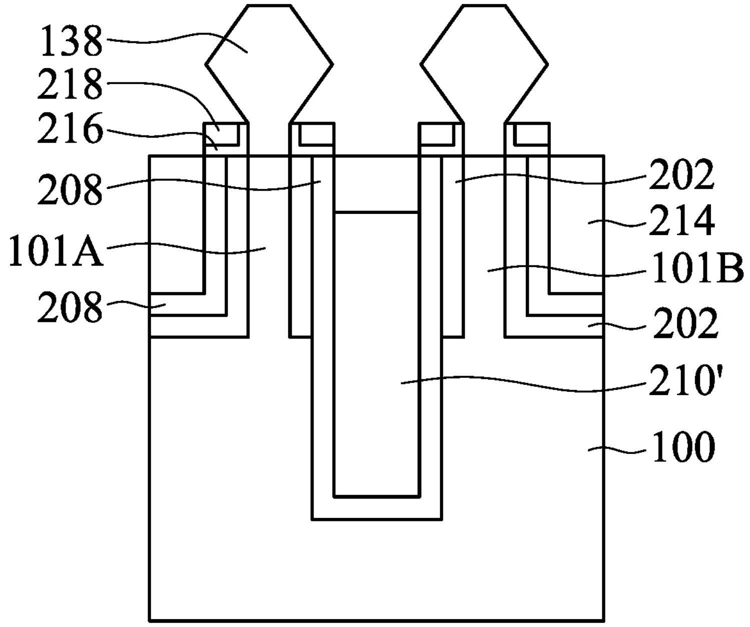
Figure 2K:
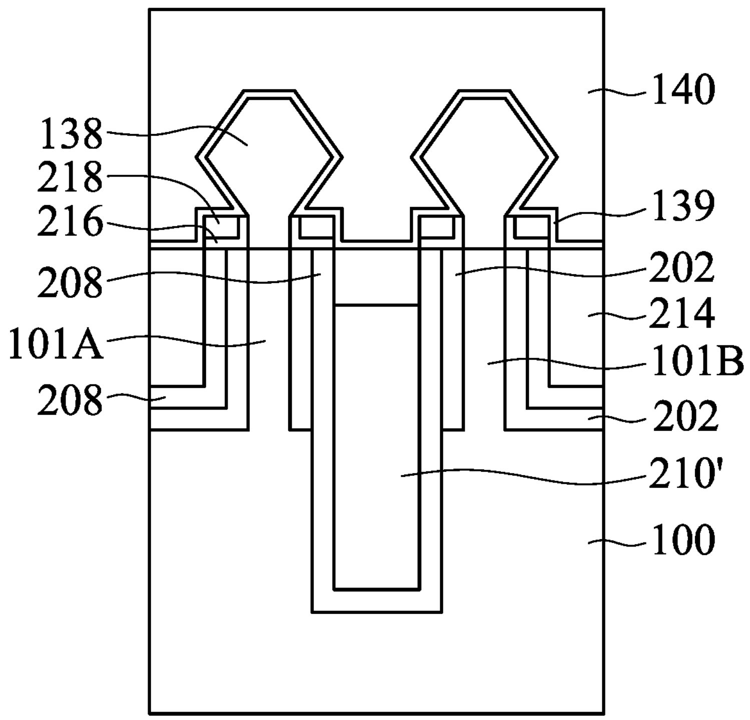
Figure 2L:
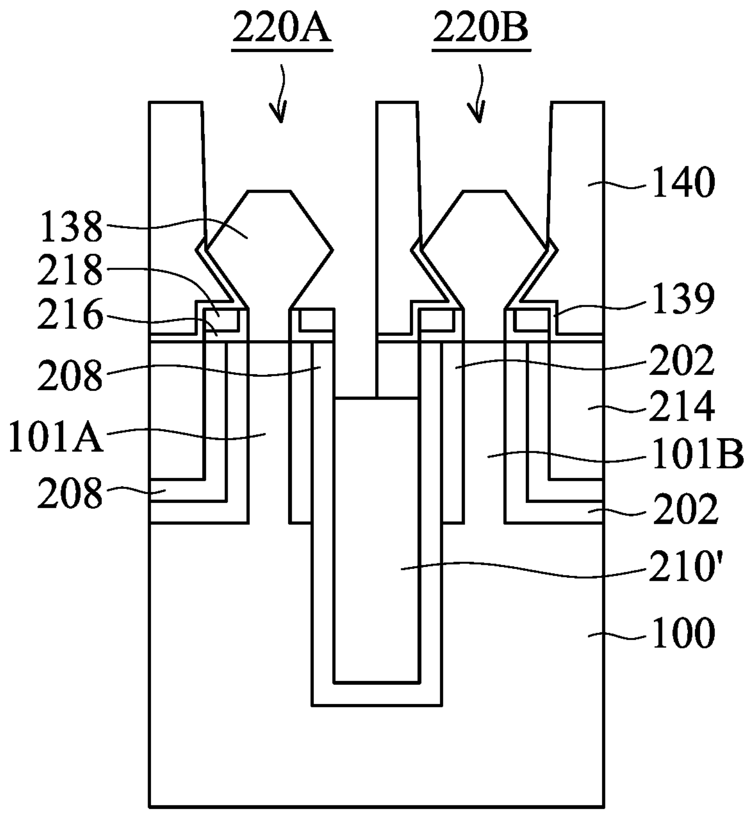
Figure 2M:
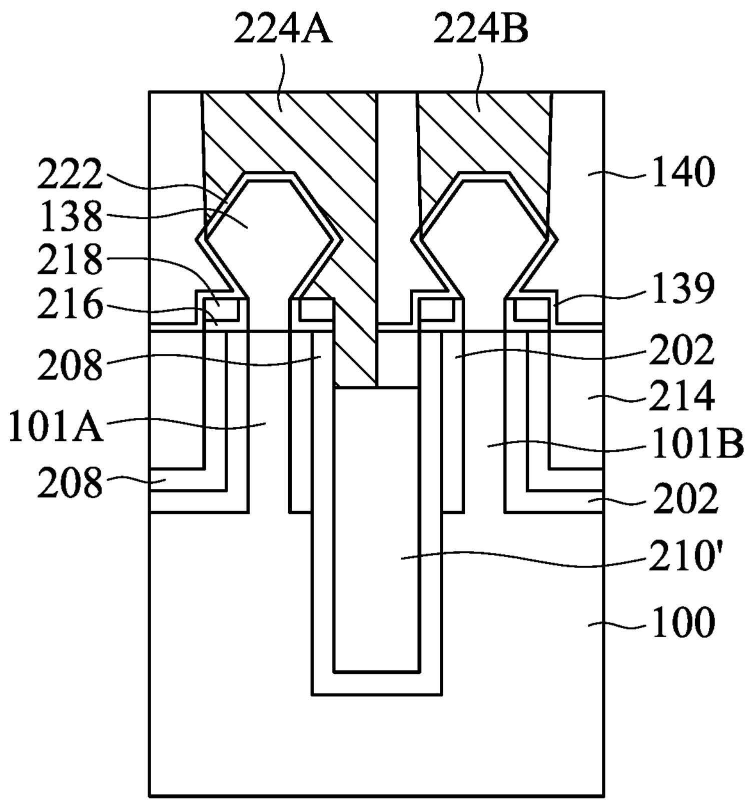
Figure 2N:
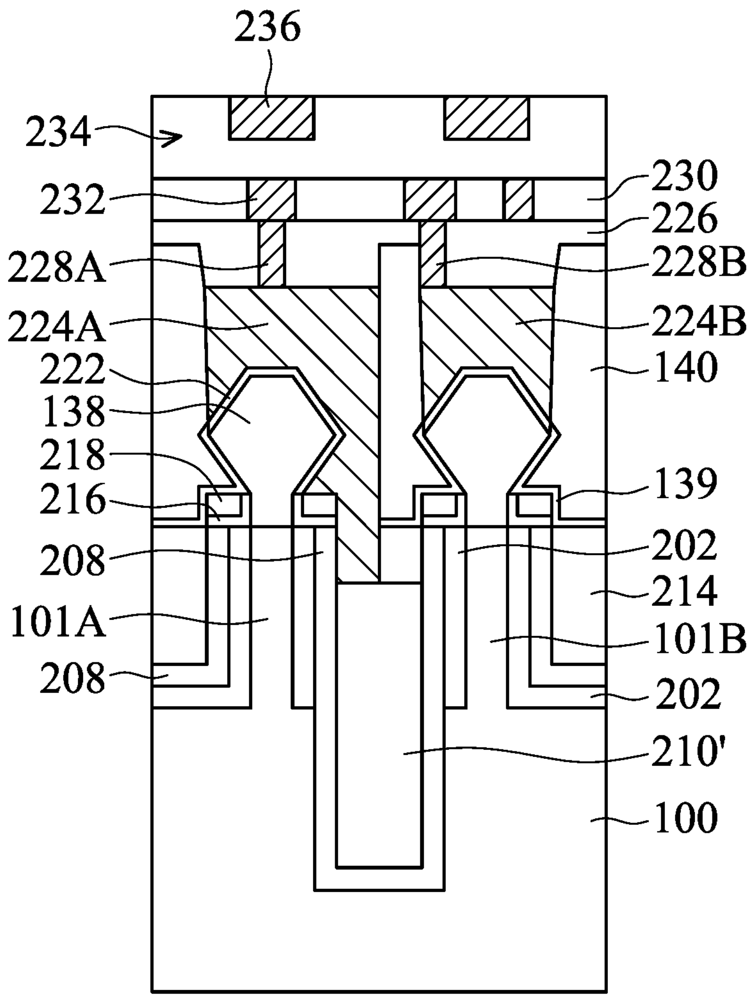
Figure 2O:
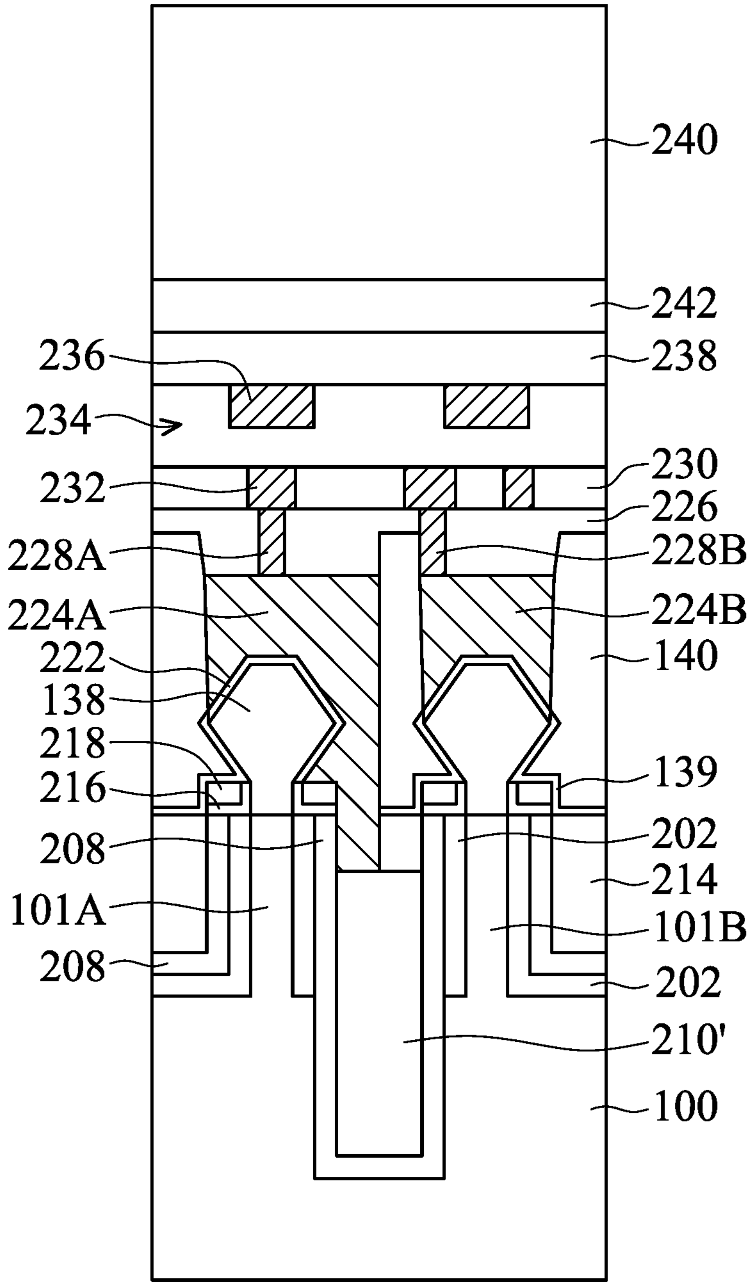
Figure 2P:
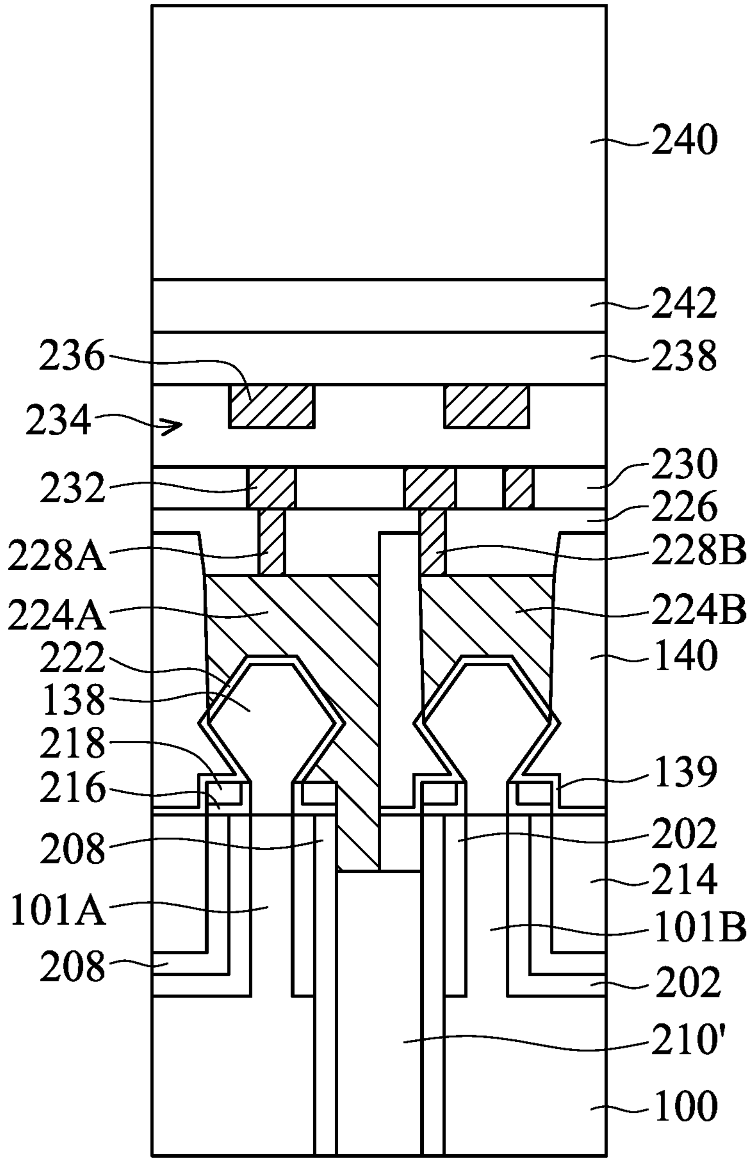
Figure 2Q:
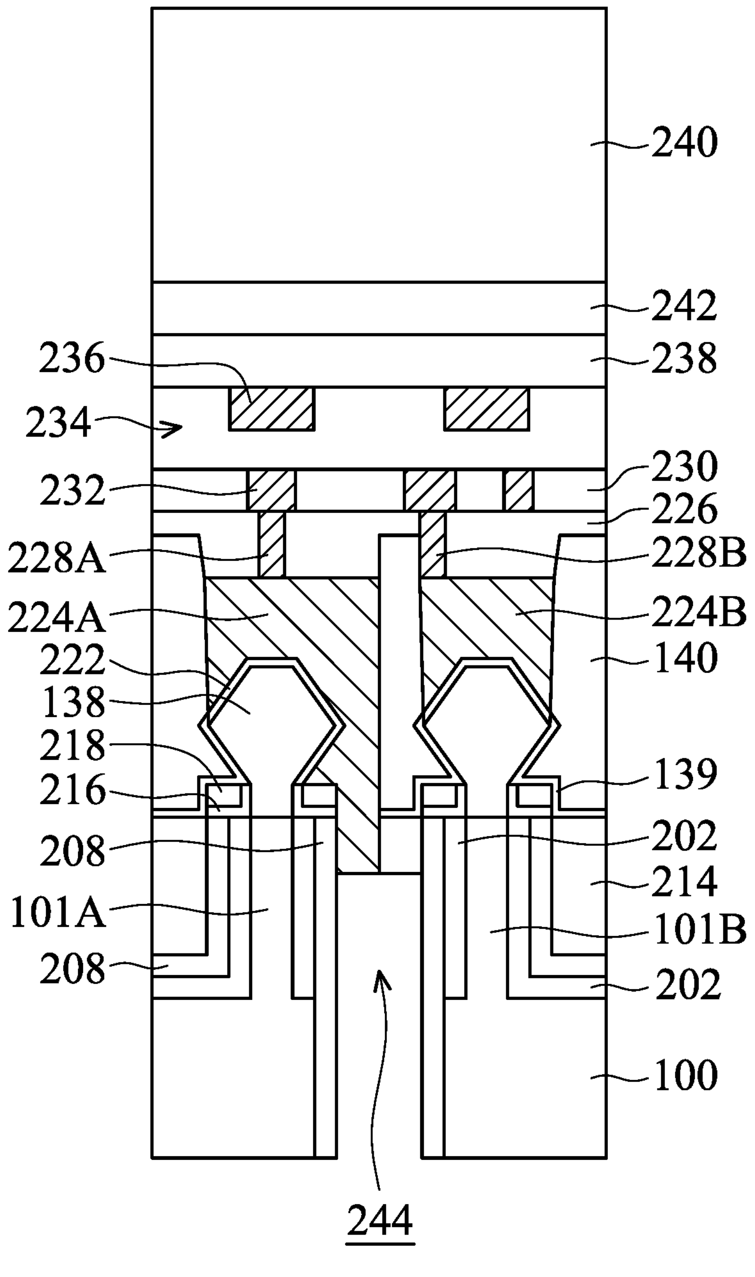
Figure 2R:
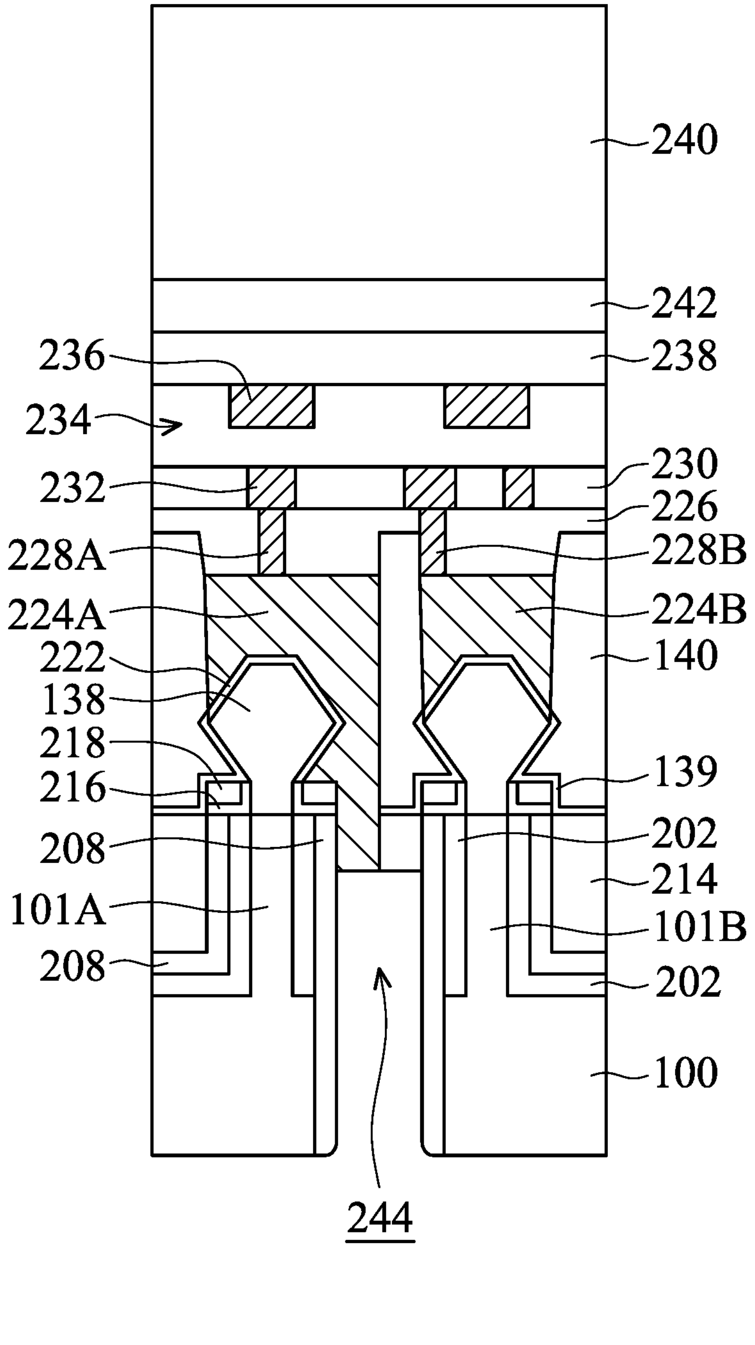
Figure 2S:
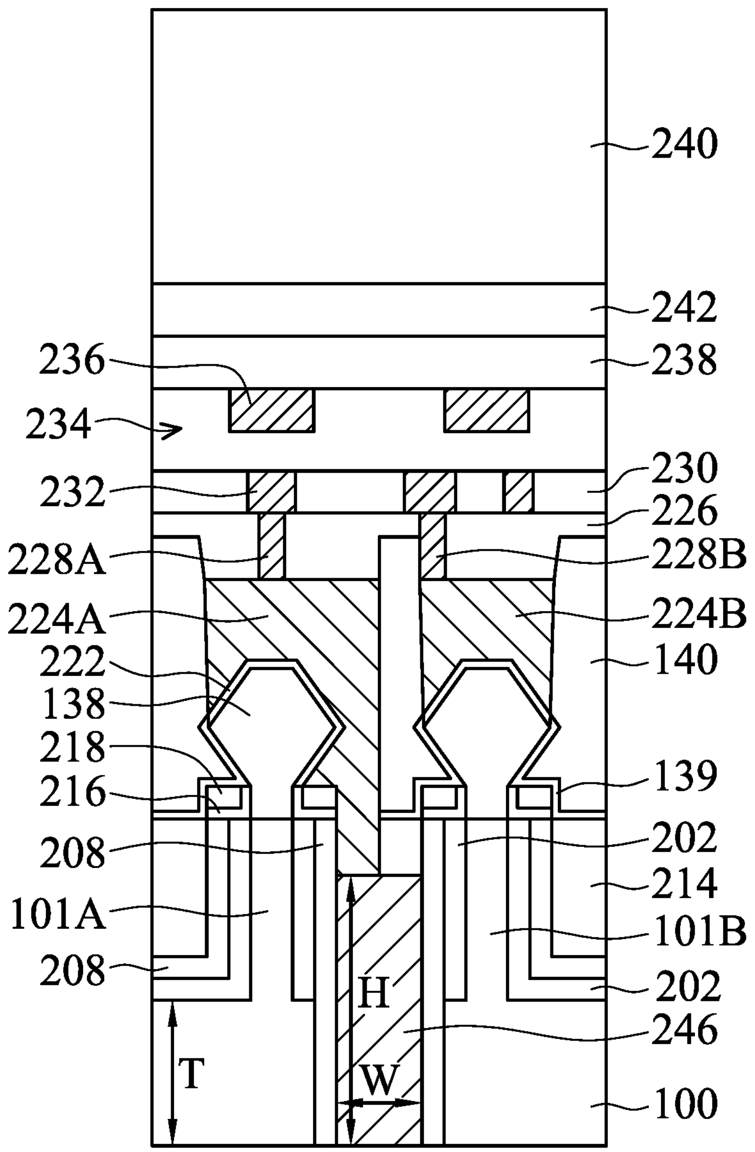
Figure 2T:
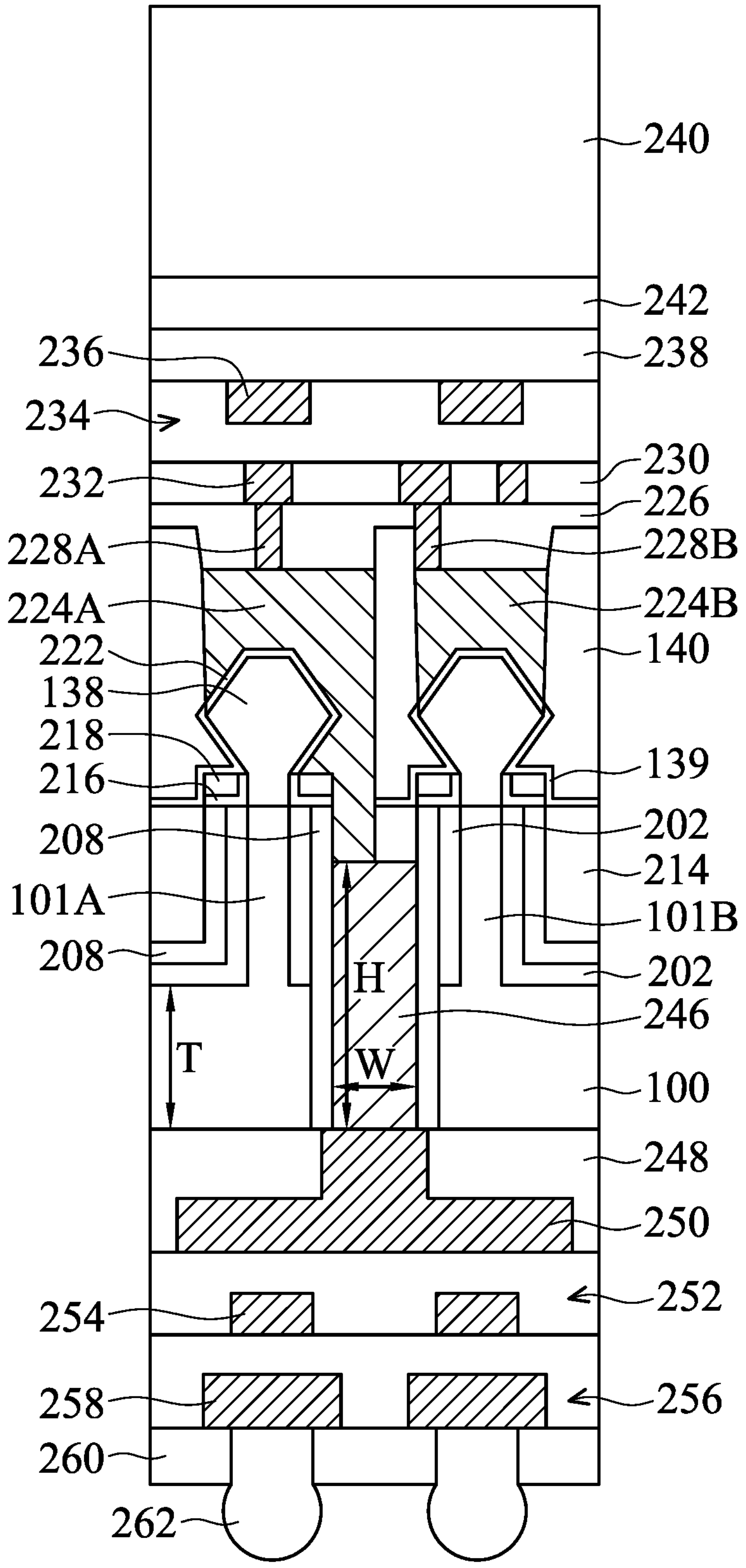

FIGS. 2A-2T are cross-sectional views of various stages of a process for forming a portion of a semiconductor device structure, in accordance with some embodiments. As shown in FIG. 2A, a semiconductor substrate 100 is received or provided. In some embodiments, the semiconductor substrate 100 is a bulk semiconductor substrate, such as a semiconductor wafer. The semiconductor substrate 100 may include silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

In some embodiments, a semiconductor stack having multiple semiconductor layers is formed over the semiconductor substrate 100. In some embodiments, the semiconductor stack includes multiple semiconductor layers 102*a*, 102*b*, 102*c*, and 102*d*. The semiconductor stack also includes multiple semiconductor layers 104*a*, 104*b*, 104*c*, and 104*d*. In some embodiments, the semiconductor layers 102*a*-102*d* and the semiconductor layers 104*a*-104*d* are laid out alternately. The semiconductor layers 102*a*-102*d* and the semiconductor layers 104*a*-104*d* have an alternating configuration.

In some embodiments, the semiconductor layers 102*a*-102*d* function as sacrificial layers that will be removed in a subsequent process to release the semiconductor layers 104*a*-104*d*. The semiconductor layers 104*a*-104*d* that are released may function as channel structures of one or more transistors.

In some embodiments, the semiconductor layers 104*a*-104*d* that will be used to form channel structures are made of a material that is different than that of the semiconductor layers 102*a*-102*d*. In some embodiments, the semiconductor layers 104*a*-104*d* are made of or include silicon, germanium, one or more other suitable materials, or a combination thereof. In some embodiments, the semiconductor layers 102*a*-102*d* are made of or include silicon germanium. In some other embodiments, the semiconductor layers 104*a*-104*d* are made of silicon germanium, and the semiconductor layers 102*a*-102*d* are made of silicon germanium with different atomic concentration of germanium than that of the semiconductor layers 104*a*-104*d*. As a result, different etching selectivity and/or different oxidation rates during subsequent processing may be achieved between the semiconductor layers 102*a*-102*d* and the semiconductor layers 104*a*-104*d*.

The present disclosure contemplates that the semiconductor layers 102*a*-102*d* and the semiconductor layers 104*a*-104*d* include any combination of semiconductor materials that can provide desired etching selectivity, desired oxidation rate differences, and/or desired performance characteristics (e.g., materials that maximize current flow).

In some embodiments, the semiconductor layers 102*a*-102*d* and 104*a*-104*d* are formed using multiple epitaxial growth operations. Each of the semiconductor layers 102*a*-102*d* and 104*a*-104*d* may be formed using a selective epitaxial growth (SEG) process, a chemical vapor deposition (CVD) process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof.

In some embodiments, the semiconductor layers 102*a*-102*d* and 104*a*-104*d* are grown in-situ in the same process chamber. In some embodiments, the growth of the semiconductor layers 102*a*-102*d* and 104*a*-104*d* are alternately and sequentially performed in the same process chamber to complete the formation of the semiconductor stack. In some embodiments, the vacuum of the process chamber is not broken before the epitaxial growth of the semiconductor stack is accomplished.

Afterwards, hard mask elements are formed over the semiconductor stack to assist in a subsequent patterning of the semiconductor stack. Each of the hard mask elements may include a first mask layer 108 and a second mask layer 110. The first mask layer 108 and the second mask layer 110 may be made of different materials. One or more photolithography processes and one or more etching processes are used to pattern the semiconductor stack into multiple fin structures 106A and 106B, as shown in FIG. 2A.

The fin structures 106A and 106B may be patterned by any suitable method. For example, the fin structures 106A and 106B may be patterned using one or more photolithography processes, including double-patterning or multi-patterning processes. Double-patterning or multi-patterning processes may combine photolithography and self-aligned processes, allowing patterns to be created that have, for example, pitches smaller than what is otherwise obtainable using a single, direct photolithography process.

Each of the fin structures 106A and 106B may include portions of the semiconductor layers 102*a*-102*d* and 104*a*-104*d* and multiple semiconductor fins 101A and 101B, as shown in FIG. 2A. The semiconductor substrate 100 may also be partially removed during the etching process that forms the fin structures 106A and 106B. Protruding portions of the semiconductor substrate 100 that remain form the semiconductor fins 101A and 101B, as shown in FIG. 2A. Each of the semiconductor fins 101A and 101B may have a fin height that is within a range from about 30 nm to about 100 nm.

Figure 1B:
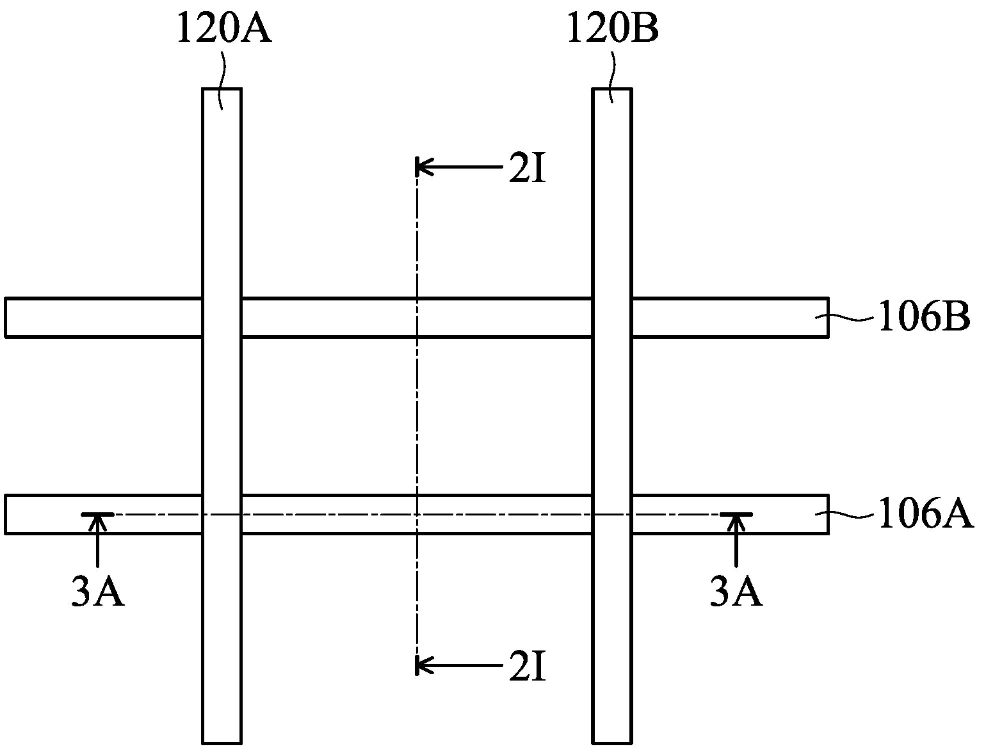

FIGS. 1A-1B are top views of various stages of a process for forming a portion of a semiconductor device structure, in accordance with some embodiments. As shown in FIG. 1A, multiple fin structures 106A and 106B are formed, in accordance with some embodiments. In some embodiments, the fin structures 106A and 106B are oriented lengthwise. In some embodiments, the extending directions of the fin structures 106A and 106B are substantially parallel to each other, as shown in FIG. 1A. In some embodiments, FIG. 2A is a cross-sectional view of the structure taken along the line 2A-2A in FIG. 1A.

As shown in FIG. 2B, a spacer layer 202 is deposited, in accordance with some embodiments. The spacer layer 202 extends along the sidewalls and tops of the fin structures 106A and 106B. The spacer layer 202 also extends along the top surface of the semiconductor substrate 100. In some embodiments, the spacer layer 202 conformally extends along the sidewalls and the tops of the fin structures 106A and 106B.

The spacer layer 202 may be made of or include silicon nitride, carbon-containing silicon nitride, silicon oxynitride, carbon-containing silicon oxynitride, silicon oxide, carbon-containing silicon oxide, one or more other suitable materials, or a combination thereof. The spacer layer 202 may be deposited using a CVD process, an atomic layer deposition (ALD) process, a CVD process, one or more other applicable processes, or a combination thereof.

As shown in FIG. 2C, the semiconductor substrate 100 is partially removed to form a trench 206 between the fin structures 106A and 106B, in accordance with some embodiments. One or more photolithography processes and one or more etching processes may be used to form the trench 206. For example, a patterned mask element 204 may be used to assist in the formation of the trench 206. The patterned mask element 204 may be a patterned photoresist layer.

Afterwards, the patterned mask element 204 is removed, as shown in FIG. 2D in accordance with some embodiments.

As shown in FIG. 2E, a spacer layer 208 is then deposited, in accordance with some embodiments. The spacer layer 208 covers the spacer layer 202. In some embodiments, the spacer layer 208 extends conformally along the sidewalls of the trench 206. The material and formation method of the spacer layer 208 may be the same as or similar to those of the spacer layer 202. The thickness of the spacer layer 208 may be within a range from about 5 nm to about 15 nm.

In some embodiments, a sacrificial material layer 210 is deposited over the structure shown in FIG. 2E. Afterwards, the sacrificial material layer 210 is recessed, as shown in FIG. 2F in accordance with some embodiments. The sacrificial material layer 210 may be made of a material that has etching selectivity to the semiconductor substrate 100 and the spacer layer 208.

The sacrificial material layer 210 may be made of or include aluminum oxide, silicon nitride, one or more other suitable materials, or a combination thereof. The sacrificial material layer 210 may be deposited using a CVD process, an ALD process, a flowable chemical vapor deposition (FCVD) process, one or more other applicable processes, or a combination thereof. The sacrificial material layer 210 may be recessed using one or more etching processes. For example, a wet etching process is used to remove the upper portion of the sacrificial material layer 210, so as to recess the sacrificial material layer 210.

As shown in FIG. 2G, a patterned mask element 212 is formed to cover the portion of the sacrificial material layer 210 that fills the trench 206, in accordance with some embodiments. The portions of the sacrificial material layer 210 outside of the trench 206 are exposed. The patterned mask element 212 is, for example, a patterned photoresist layer.

As shown in FIG. 2H, the portions of the sacrificial material layer 210 outside of the trench 206 are removed, in accordance with some embodiments. As a result, the remaining portion of the sacrificial material layer 210 forms a sacrificial structure 210', as shown in FIG. 2H. With the patterned mask element 212 as an etching mask, the portions of the sacrificial material layer 210 outside of the trench 206 are removed using an etching process.

After the formation of the sacrificial structure 210', the patterned mask element 212 is removed. As shown in FIG. 2I, an isolation structure 214 is formed over the sacrificial structure 210', in accordance with some embodiments. The isolation structure 214 also surrounds lower portions of the fin structures 106A and 106B.

In some embodiments, one or more dielectric layers are deposited over the fin structures 106A and 106B and the sacrificial structure 210'. The dielectric layers may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof. The dielectric layers may be deposited using a flowable chemical vapor deposition (FCVD) process, an atomic layer deposition (ALD) process, a chemical vapor deposition (CVD) process, one or more other applicable processes, or a combination thereof.

Afterwards, a planarization process is used to partially remove the dielectric layers. The hard mask elements (including the first mask layer 108 and the second mask layer 110) may also function as a stop layer of the planarization process. The planarization process may include a chemical mechanical polishing (CMP) process, a grinding process, a dry polishing process, an etching process, one or more other applicable processes, or a combination thereof.

Afterwards, one or more etching back processes are used to partially remove the dielectric layers. As a result, the remaining portion of the dielectric layers forms the isolation structure 214. Upper portions of the fin structures 106A and 106B protrude from the top surface of the isolation structure 214, as shown in FIG. 2I.

In some embodiments, the etching back process for forming the isolation structure 214 is carefully controlled to ensure that the topmost surface of the isolation structure 214 is positioned at a suitable height level, as shown in FIG. 2I. In some embodiments, the topmost surface of the isolation structure 214 is below the bottommost surface of the semiconductor layer 102*a* that functions as a sacrificial layer.

Afterwards, the hard mask elements (including the first mask layer 108 and the second mask layer 110) are removed. Alternatively, in some other embodiments, the hard mask elements are removed or consumed during the planarization process and/or the etching back process that forms the isolation structure 214.

Figure 3A:
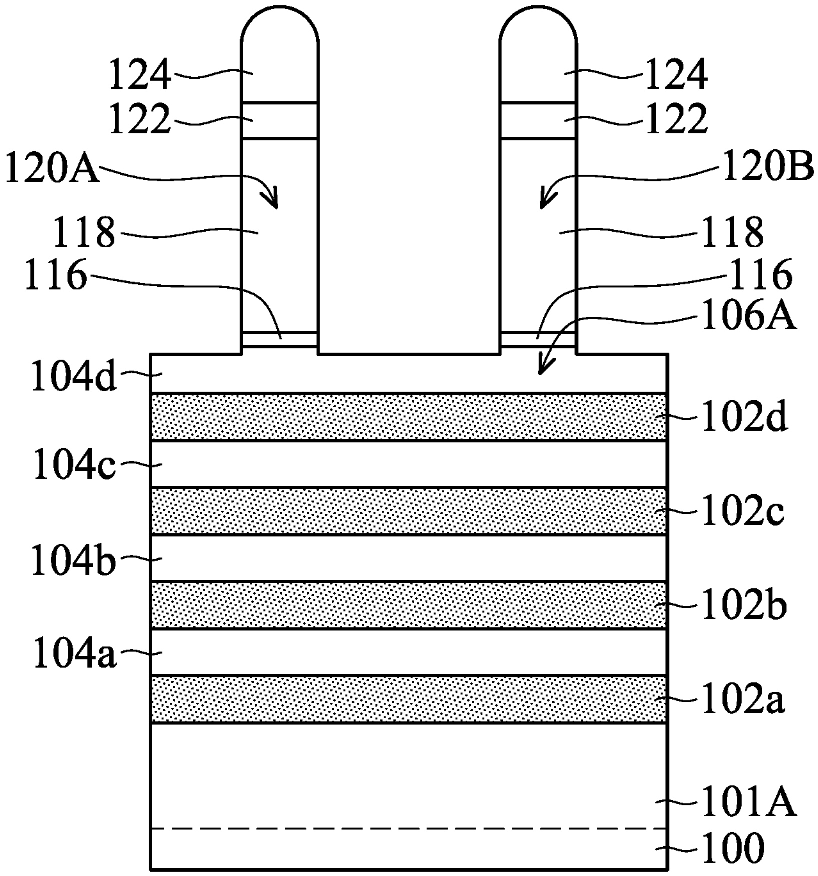
FIGS. 3A-3K are cross-sectional views of various stages of a process for forming a portion of a semiconductor device structure, in accordance with some embodiments.

Afterwards, dummy gate stacks 120A and 120B are formed to extend across the fin structures 106A and 106B, as shown in FIG. 1B in accordance with some embodiments. In some embodiments, FIG. 2I is a cross-sectional view of the structure taken along the line 2I-2I in FIG. 1B. Since the line 2I-2I does not overlaps the dummy gate stacks 120A and 120B, no dummy gate stack is shown in FIG. 2I. FIGS. 3A-3K are cross-sectional views of various stages of a process for forming a portion of a semiconductor device structure, in accordance with some embodiments. In some embodiments, FIG. 3A is a cross-sectional view of the structure taken along the lines 3A-3A in FIG. 1B.

As shown in FIGS. 1B and 3A, the dummy gate stacks 120A and 120B are formed to partially cover and to extend across the fin structures 106A and 106B, in accordance with some embodiments. In some embodiments, the dummy gate stacks 120A and 120B are wrapped around the fin structures 106A and 106B. As shown in FIGS. 1B and 2I, other portions of the fin structures 106A and 106B are exposed without being covered by the dummy gate stacks 120A and 120B.

As shown in FIG. 3A, each of the dummy gate stacks 120A and 120B includes a dummy gate dielectric layer 116 and a dummy gate electrode 118. The dummy gate dielectric layer 116 may be made of or include silicon oxide or another suitable material. The dummy gate electrodes 118 may be made of or include polysilicon or another suitable material.

In some embodiments, a dummy gate dielectric material layer and a dummy gate electrode layer are sequentially deposited over the isolation structure 214 and the fin structures 106A and 106B. The dummy gate dielectric material layer may be deposited using an ALD process, a CVD process, one or more other applicable processes, or a combination thereof. The dummy gate electrode layer may be deposited using a CVD process. Afterwards, the dummy gate dielectric material layer and the dummy gate electrode layer are patterned to form the dummy gate stacks 120A and 120B.

In some embodiments, hard mask elements including mask layers 122 and 124 are used to assist in the patterning process for forming the dummy gate stacks 120A and 120B. With the hard mask elements as an etching mask, one or more etching processes are used to partially remove the dummy gate dielectric material layer and the dummy gate electrode layer. As a result, remaining portions of the dummy gate dielectric material layer and the dummy gate electrode layer form the dummy gate stacks 120A and 120B.

Figure 3B:
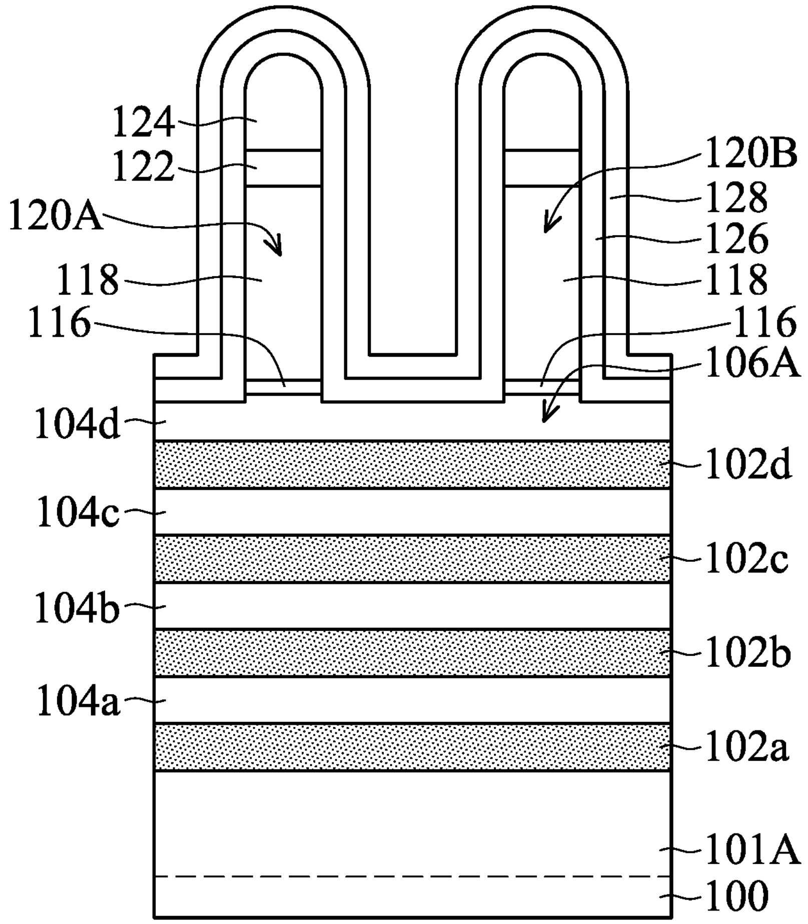

As shown in FIG. 3B, spacer layers 126 and 128 are then deposited over the dummy gate stacks 120A and 120B and the fin structure 106A, in accordance with some embodiments. The spacer layers 126 and 128 extend along the tops and sidewalls of the dummy gate stacks 120A and 120B, as shown in FIG. 3B. The spacer layers 126 and 128 further extend along the tops and sidewalls of the portions of the fin structures 106A and 106B that are not covered by the dummy gate stacks 120A and 120B.

In some embodiments, the spacer layers 126 and 128 are made of different materials. The spacer layer 126 may be made of a dielectric material that has a low dielectric constant. The spacer layer 126 may be made of or include silicon carbide, silicon oxycarbide, carbon-containing silicon oxynitride, silicon oxide, one or more other suitable materials, or a combination thereof. In some embodiments, the spacer layer 126 is a single layer. In some other embodiments, the spacer layer 126 includes multiple sub-layers. Some of the sub-layers may be made of different materials. Some of the sub-layers may be made of similar materials with different compositions. For example, one of the sub-layers may have a greater atomic concentration of carbon than other sub-layers.

The spacer layer 128 may be made of a dielectric material that can provide more protection to the gate stacks during subsequent processes. The spacer layer 128 may have a greater dielectric constant than that of the spacer layer 126. The spacer layer 128 may be made of silicon nitride, silicon oxynitride, carbon-containing silicon nitride, carbon-containing silicon oxynitride, one or more other suitable materials, or a combination thereof. The spacer layers 126 and 128 may be sequentially deposited using a CVD process, an ALD process, a physical vapor deposition (PVD) process, one or more other applicable processes, or a combination thereof.

However, embodiments of the disclosure are not limited thereto. Many variations and/or modifications can be made to embodiments of the disclosure. In some other embodiments, the spacer layers 126 and 128 are made of the same material. In some other embodiments, the spacer layer 128 is deposited before the spacer layer 126. In these cases, the spacer layer 128 is between the spacer layer 126 and the dummy gate electrode 118.

Figure 3C:
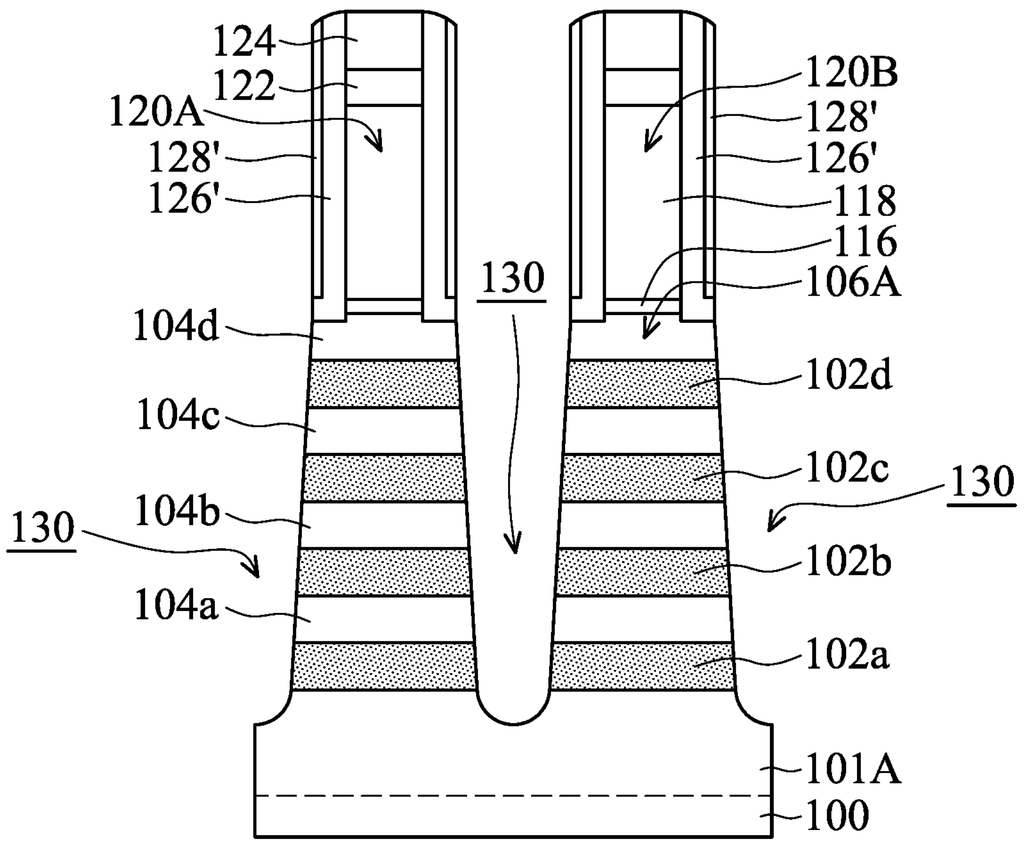

As shown in FIG. 3C, the spacer layers 126 and 128 are partially removed, in accordance with some embodiments. One or more anisotropic etching processes may be used to partially remove the spacer layers 126 and 128. As a result, some remaining portions of the spacer layers 126 and 128 form spacer elements 126' and 128', respectively. The spacer elements 126' and 128' extend along the sidewalls of the dummy gate stacks 120A and 120B, as shown in FIG. 3C. Some other remaining portions of the spacer layers 126 and 128 form support elements 216 and 218 that will be illustrated later with reference made to FIG. 2J.

Afterwards, the fin structures 106A and 106B are partially removed, in accordance with some embodiments. The portions of the fin structures 106A and 106B not covered by the dummy gate stacks 120A and 120B are recessed. As a result, the recesses 130 are formed, as shown in FIG. 3C. The recesses 130 may be used to contain epitaxial structures (such as source/drain structures) that will be formed later.

One or more etching processes may be used to form the recesses 130. In some embodiments, a dry etching process is used to form the recesses 130. Alternatively, a wet etching process may be used to form the recesses 130. In some embodiments, the recesses 130 penetrate into the fin structure 106A. In some embodiments, the recesses 130 further extend into the semiconductor fin 101A, as shown in FIG. 3C. In some embodiments, the spacer elements 126' and 128' and the recesses 130 are formed simultaneously using the same etching process.

In some embodiments, each of the recesses 130 has slanted sidewalls. Upper portions of the recesses 130 are larger (or wider) than lower portions of the recesses 130. In these cases, due to the profile of the recesses 130, the upper semiconductor layer (such as the semiconductor layer 104*d*) is shorter than the lower semiconductor layer (such as the semiconductor layer 104*b*).

However, embodiments of the disclosure have many variations. In some other embodiments, the recesses 130 have substantially vertical sidewalls. In these cases, due to the profile of the recesses 130, the upper semiconductor layer (such as the semiconductor layer 104*d*) is substantially as wide as the lower semiconductor layer (such as the semiconductor layer 104*b*).

Figure 3D:
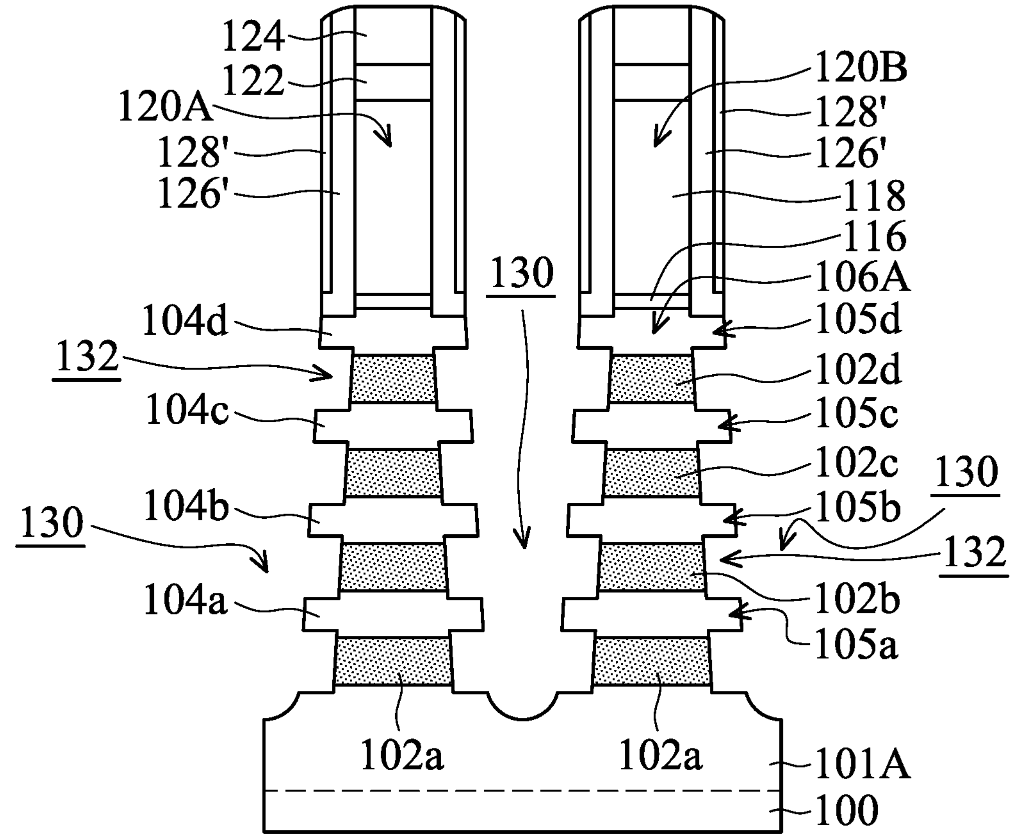

Afterwards, as shown in FIG. 3D, the semiconductor layers 102*a*-102*d* are laterally etched, in accordance with some embodiments. As a result, edges of the semiconductor layers 102*a*-102*d* retreat from edges of the semiconductor layers 104*a*-104*d*. As shown in FIG. 3D, recesses 132 are formed due to the lateral etching of the semiconductor layers 102*a*-102*d*. The recesses 132 may be used to contain inner spacers that will be formed later. The semiconductor layers 102*a*-102*d* may be laterally etched using a wet etching process, a dry etching process, or a combination thereof. In some other embodiments, the semiconductor layers 102*a*-102*d* are partially oxidized before being laterally etched.

During the lateral etching of the semiconductor layers 102*a*-102*d*, the semiconductor layers 104*a*-104*d* may also be slightly etched. As a result, edge portions of the semiconductor layers 104*a*-104*d* are partially etched and thus shrink to become edge elements 105*a*-105*d*, as shown in FIG. 3D. As shown in FIG. 3D, each of the edge elements 105*a*-105*d* of the semiconductor layers 104*a*-104*d* is thinner than the corresponding inner portion of the semiconductor layers 104*a*-104*d*.

Figure 3E:
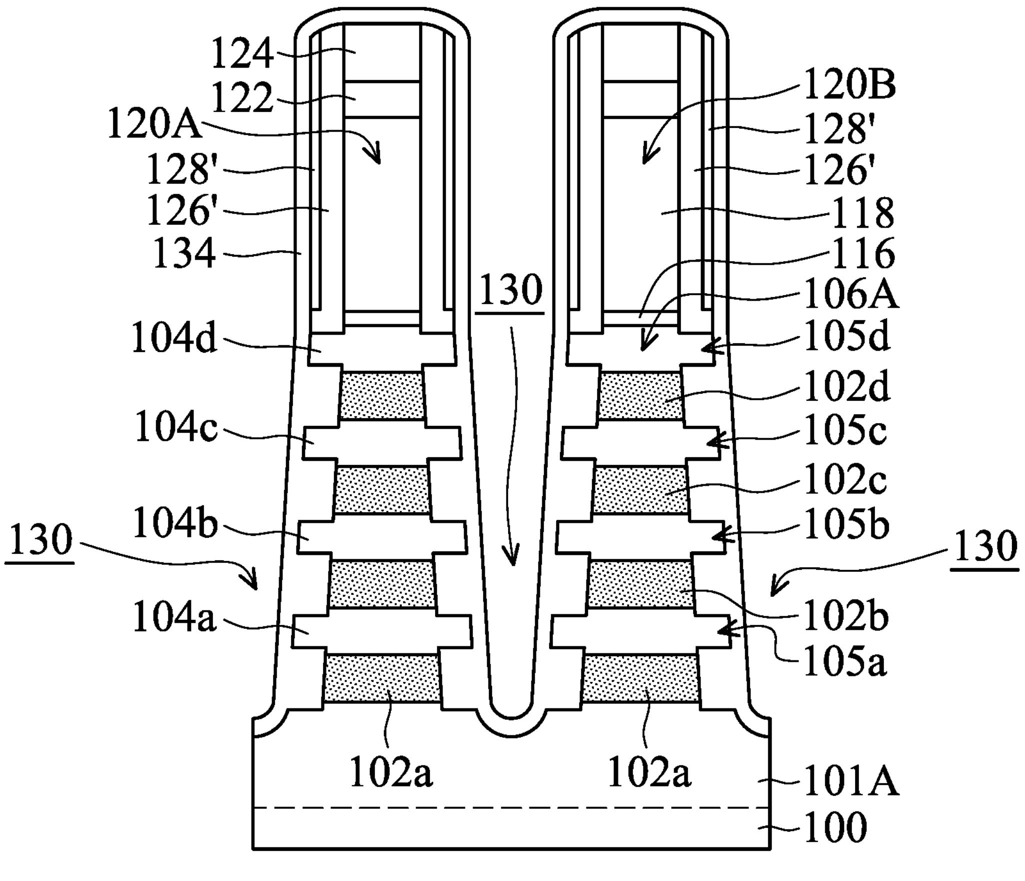

As shown in FIG. 3E, an insulating layer 134 is deposited over the structure shown in FIG. 3D, in accordance with some embodiments. The insulating layer 134 covers the dummy gate stacks 120A and 120B and fills the recesses 132. In some embodiments, the insulating layer 134 is a single layer. In some other embodiments, the insulating layer 134 includes multiple sub-layers. Some of the sub-layers may be made of different materials and/or contain different compositions.

The insulating layer 134 may be made of or include carbon-containing silicon nitride (SiCN), carbon-containing silicon oxynitride (SiOCN), carbon-containing silicon oxide (SiOC), silicon oxide, silicon nitride, one or more other suitable materials, or a combination thereof. The insulating layer 134 may be deposited using a CVD process, an ALD process, one or more other applicable processes, or a combination thereof.

Figure 3F:
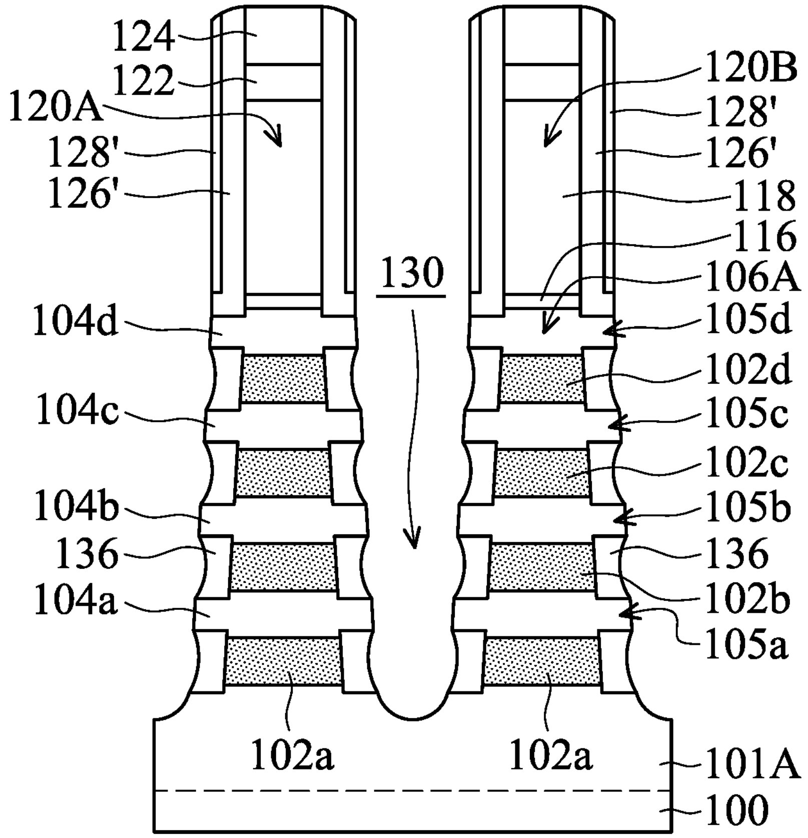

As shown in FIG. 3F, an etching process is used to partially remove the insulating layer 134, in accordance with some embodiments. The portions of the insulating layer 134 outside of the recesses 132 may be removed. The remaining portions of the insulating layer 134 form inner spacers 136, as shown in FIG. 3F. The etching process may include a dry etching process, a wet etching process, or a combination thereof.

The inner spacers 136 cover the edges of the semiconductor layers 102*a*-102*d*. The inner spacers 136 may be used to prevent subsequently formed epitaxial structures (that function as, for example, source/drain structures) from being damaged during a subsequent process for removing the sacrificial layers 102*a*-102*d*. In some embodiments, the inner spacers 136 are made of a low-k material that has a lower dielectric constant than that of silicon oxide. In these cases, the inner spacers 136 may also be used to reduce parasitic capacitance between the subsequently formed source/drain structures and the gate stacks. As a result, the operation speed of the semiconductor device structure may be improved.

In some embodiments, after the etching process for forming the inner spacers 136, portions of the semiconductor fin 101A originally covered by the insulating layer 134 are exposed by the recesses 130, as shown in FIG. 3F. The edges of the semiconductor layers 104*a*-104*d* are also exposed by the recesses 130, as shown in FIG. 3F.

Figure 3G:
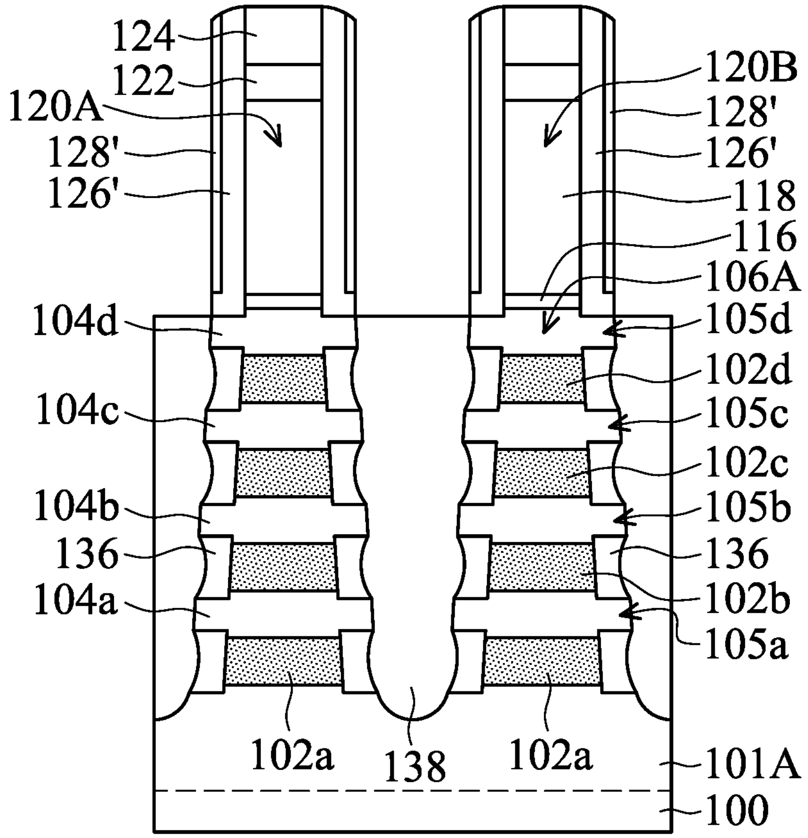

As shown in FIGS. 2J and 3G, epitaxial structures 138 are formed, in accordance with some embodiments. In some other embodiments, the epitaxial structures 138 overfill the recesses 130 to ensure full contact between the epitaxial structures 138 and the semiconductor layers 104*d*. In some embodiments, the top surfaces of the epitaxial structures 138 are higher than the top surface of the dummy gate dielectric layer 116. In some other embodiments, the epitaxial structures 138 partially fill the recesses 130.

As mentioned above, some remaining portions of the spacer layers 126 and 128 form the support elements 216 and 218. The support elements 216 and 218 may be used to confine the formation of the epitaxial structures 138. As a result, the epitaxial structures 138 that have desired profile and size are formed.

In some embodiments, the epitaxial structures 138 connect to the semiconductor layers 104*a*-104*d*. Portions of the semiconductor layers 104*a*-104*d* that will be function as channel structures are sandwiched between two respective epitaxial structures 138, as shown in FIG. 3G. In some embodiments, the epitaxial structures 138 are designed to function as source/drain structures of p-channel field-effect transistors (PFET). The epitaxial structures 138 may include epitaxially grown silicon germanium (SiGe), epitaxially grown silicon, or another suitable epitaxially grown semiconductor material. In some other embodiments, the epitaxial structures 138 are designed to function as source/drain structures of n-channel field-effect transistors (NFET). The epitaxial structures 138 may include epitaxially grown silicon or another suitable epitaxially grown semiconductor material. The source/drain structure(s) may refer to a source structure or a drain structure, individually or collectively dependent upon the context.

In some embodiments, the epitaxial structures 138 are designed to function as source/drain structures of n-channel field-effect transistors (NFET). In these cases, the epitaxial structure 138 is n-type doped. In some embodiments, the epitaxial structures 138 is doped with one or more suitable n-type dopants. For example, the epitaxial structures 138 is a Si source/drain feature that is doped with phosphor (P), antimony (Sb), arsenic (As), or another suitable dopant.

Embodiments of the disclosure are not limited thereto. Many variations and/or modifications can be made to embodiments of the disclosure. In some other embodiments, the epitaxial structures 138 are designed to function as source/drain structures of p-channel field-effect transistors (PFET). In these cases, the epitaxial structure 138 is p-type doped. In some embodiments, the epitaxial structures 138 is doped with one or more suitable p-type dopants. For example, the epitaxial structures 138 is a SiGe source/drain feature or a Si source/drain feature that is doped with boron (B), gallium (Ga), indium (In), or another suitable dopant.

In some embodiments, the epitaxial structures 138 are formed using multiple epitaxial growth operations. In some embodiments, these epitaxial growth operations are performed in-situ in the same process chamber. In some embodiments, the vacuum of the process chamber is not broken before the formation of the epitaxial structures 138 is accomplished. The reaction gases may be varied in the reaction chamber during the epitaxial growth operations.

These epitaxial growth operations may be achieved using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof. In some embodiments, the formation of the epitaxial structures 138 involves one or more etching processes that are used to fine-tune the shapes of the epitaxial structures 138.

In some embodiments, the epitaxial structures 138 are doped in-situ during their epitaxial growth. The initial reaction gas mixture for forming the epitaxial structures 138 contains respective dopants. In some embodiments, the epitaxial structures 138 are further exposed to one or more annealing processes to activate the dopants. For example, a rapid thermal annealing process is used. During the one or more annealing processes, the sacrificial structure 210' remains stable.

Figure 3H:
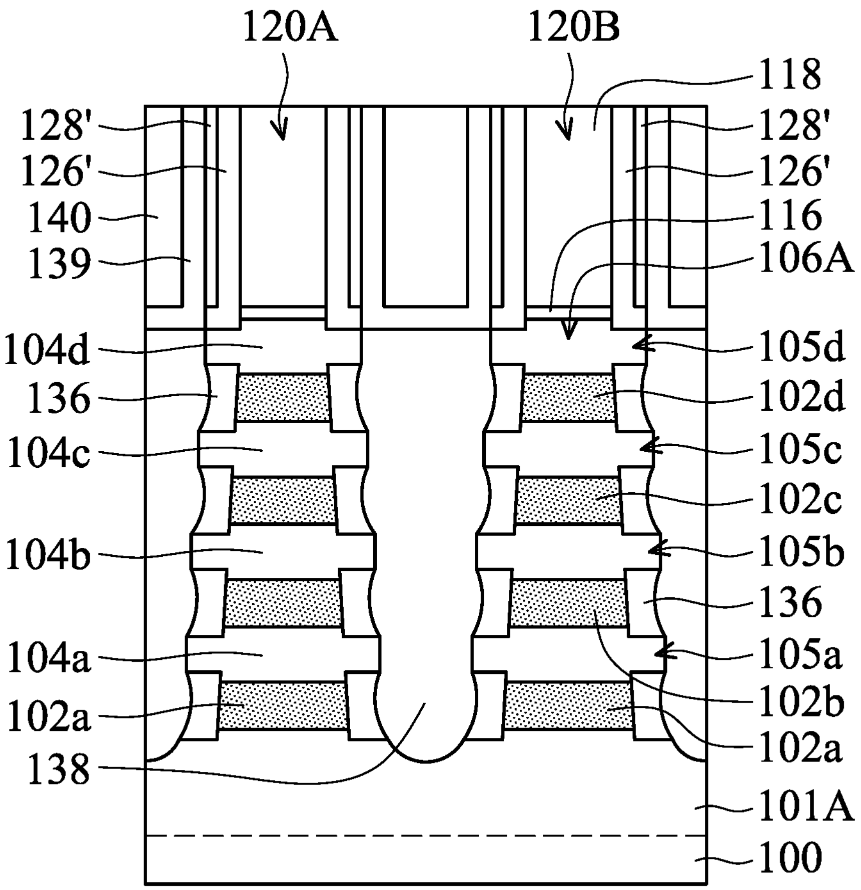

Afterwards, as shown in FIGS. 2K and 3H, a contact etch stop layer 139 and a dielectric layer 140 are formed to cover the epitaxial structures 138 and to surround the dummy gate stacks 120A and 120B, in accordance with some embodiments. The contact etch stop layer 139 may be made of or include silicon nitride, silicon oxynitride, silicon carbide, aluminum oxide, one or more other suitable materials, or a combination thereof. The dielectric layer 140 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof.

In some embodiments, an etch stop material layer and a dielectric material layer are sequentially deposited. The etch stop material layer may be deposited using a CVD process, an ALD process, a PVD process, one or more other applicable processes, or a combination thereof. The dielectric material layer may be deposited using an FCVD process, a CVD process, an ALD process, one or more other applicable processes, or a combination thereof.

Afterwards, a planarization process is used to partially remove the etch stop material layer and the dielectric material layer. As a result, the remaining portions of the etch stop material layer and the dielectric material layer respectively form the contact etch stop layer 139 and the dielectric layer 140, as shown in FIG. 3H. The planarization process may include a CMP process, a grinding process, an etching process, a dry polishing process, one or more other applicable processes, or a combination thereof. In some embodiments, the mask layers 122 and 124 originally over the dummy gate stacks 120A and 120B are removed during the planarization process. In some embodiments, after the planarization process, the top surfaces of the contact etch stop layer 139, the dielectric layer 140, and the dummy gate electrodes 118 are substantially level.

Figure 3I:
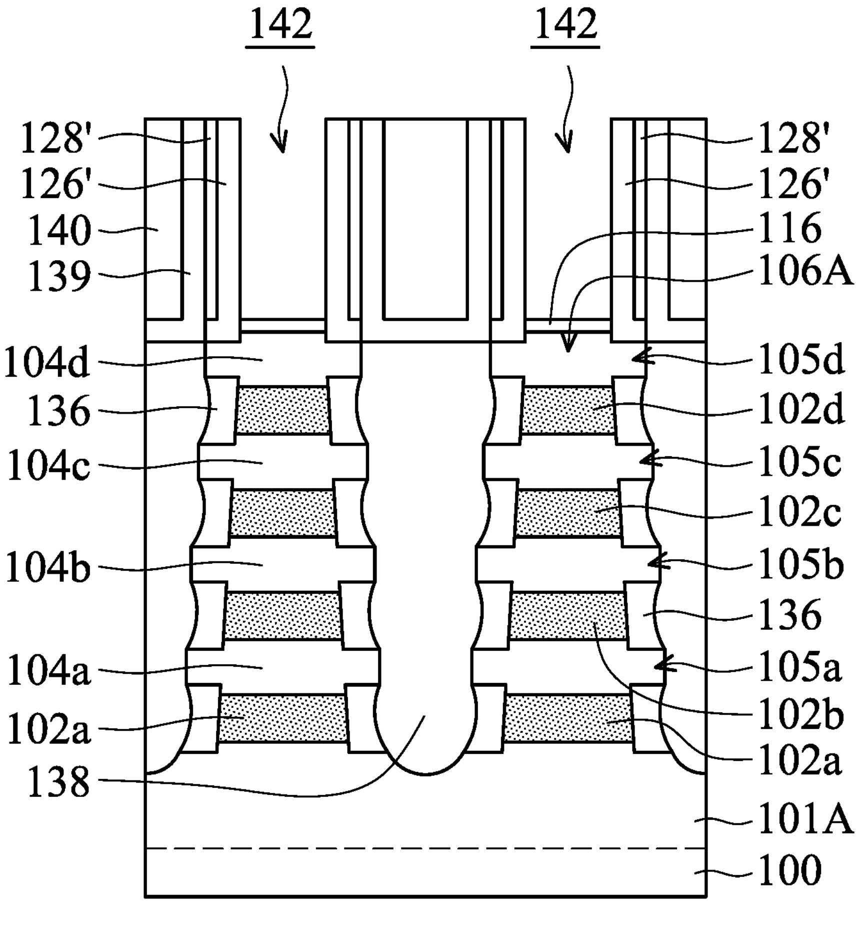

As shown in FIG. 3I, the dummy gate electrodes 118 are removed to form trenches 142 using one or more etching processes, in accordance with some embodiments. The trenches 142 are surrounded by the dielectric layer 140. The trenches 142 expose the dummy gate dielectric layer 116.

Figure 3J:
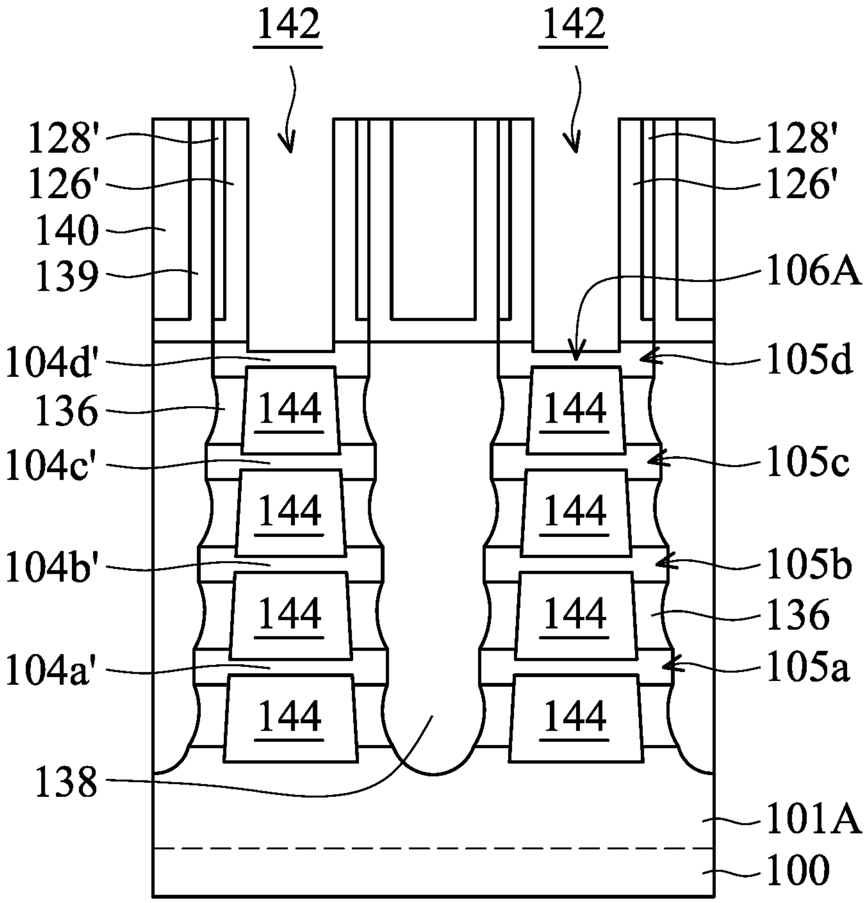

As shown in FIG. 3J, the dummy gate dielectric layer 116 and the semiconductor layers 102*a*-102*d* (that function as sacrificial layers) are removed, in accordance with some embodiments. In some embodiments, one or more etching processes are used to remove the dummy gate dielectric layer 116 and the semiconductor layers 102*a*-102*d*. As a result, recesses 144 are formed, as shown in FIG. 3J.

Due to high etching selectivity, the semiconductor layers 104*a*-104*d* are slightly (or substantially not) etched. The remaining portions of the semiconductor layers 104*a*-104*d* form multiple semiconductor nanostructures 104*a*'-104*d*'. The semiconductor nanostructures 104*a*'-104*d*' are constructed by or made up of the remaining portions of the semiconductor layers 104*a*-104*d*. The semiconductor nanostructures 104*a*'-104*d*' may function as channel structures of transistors.

In some embodiments, the etchant used for removing the semiconductor layers 102*a*-102*d* also slightly removes the semiconductor layers 104*a*-104*d* that form the semiconductor nanostructures 104*a*'-104*d*'. As a result, the obtained semiconductor nanostructures 104*a*'-104*d*' become thinner after the removal of the semiconductor layers 102*a*-102*d*. In some embodiments, each of the semiconductor nanostructures 104*a*'-104*d*' is thinner than the edge portions 105*a*-105*d* since the edge portions 105*a*-105*d* are surrounded by other elements and thus are prevented from being reached and etched by the etchant.

After the removal of the semiconductor layers 102*a*-102*d* (that function as sacrificial layers), the recesses 144 are formed. The recesses 144 connect to the trench 142 and surround each of the semiconductor nanostructures 104*a*'-104*d*'. As shown in FIG. 3J, even if the recesses 144 between the semiconductor nanostructures 104*a*'-104*d*' are formed, the semiconductor nanostructures 104*a*'-104*d*' remain held by the epitaxial structures 138. Therefore, after the removal of the semiconductor layers 102*a*-102*d* (that function as sacrificial layers), the released semiconductor nanostructures 104*a*'-104*d*' are prevented from falling.

During the removal of the semiconductor layers 102*a*-102*d* (that function as sacrificial layers), the inner spacers 136 protect the epitaxial structures 138 from being etched or damaged. The quality and reliability of the semiconductor device structure are improved.

Figure 3K:
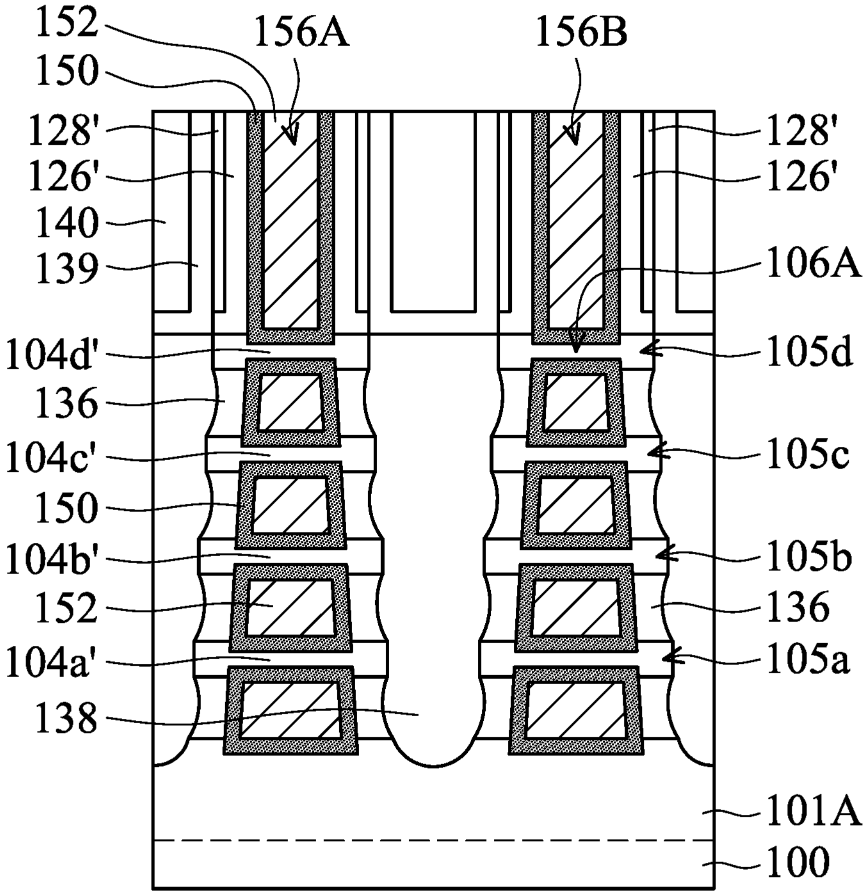

As shown in FIG. 3K, metal gate stacks 156A and 156B are formed to fill the trenches 142, in accordance with some embodiments. The metal gate stacks 156A and 156B further extend into the recesses 144, so as to be wrapped around each of the semiconductor nanostructures 104*a*'-104*d*'.

Each of the metal gate stacks 156A and 156B includes multiple metal gate stack layers. Each of the metal gate stacks 156A and 156B may include a gate dielectric layer 150 and a metal gate electrode 152. The metal gate electrode 152 may include one or more work function layers. The metal gate electrode 152 may further include a conductive filling. In some embodiments, the formation of the metal gate stacks 156A and 156B involves the deposition of multiple metal gate stack layers over the dielectric layer 140 to fill the trenches 142 and the recesses 144. The metal gate stack layers extend into the recesses 144 and are wrapped around each of the semiconductor nanostructures 104*a*'-104*d*'.

In some embodiments, the gate dielectric layer 150 is made of or includes a dielectric material with high dielectric constant (high-K). The gate dielectric layer 150 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. The gate dielectric layer 150 may be deposited using an ALD process, a CVD process, one or more other applicable processes, or a combination thereof.

In some embodiments, before the formation of the gate dielectric layer 150, interfacial layers are formed on the surfaces of the semiconductor nanostructures 104*a*'-104*d*'. The interfacial layers are very thin and are made of silicon oxide or germanium oxide, for example.

The work function layer of the metal gate electrode 152 may be used to provide the desired work function for transistors to enhance device performance including improved threshold voltage. In some embodiments, the work function layer is used for forming a PMOS device. The work function layer is a p-type work function layer. The p-type work function layer is capable of providing a work function value that is suitable for the device, which may be equal to or greater than about 4.8 eV.

The p-type work function layer may include metal, metal carbide, metal nitride, one or more other suitable materials, or a combination thereof. For example, the p-type metal includes tantalum nitride, tungsten nitride, titanium, titanium nitride, one or more other suitable materials, or a combination thereof.

In some embodiments, the work function layer is used for forming an NMOS device. The work function layer is an n-type work function layer. The n-type work function layer is capable of providing a work function value that is suitable for the device, which may be equal to or less than about 4.5 eV.

The n-type work function layer may include metal, metal carbide, metal nitride, or a combination thereof. For example, the n-type work function layer includes titanium nitride, tantalum, tantalum nitride, one or more other suitable materials, or a combination thereof. In some embodiments, the n-type work function is an aluminum-containing layer. The aluminum-containing layer may be made of or include TiAlC. TiAlO, TiAlN, one or more other suitable materials, or a combination thereof.

The work function layer may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer may be fine-tuned to adjust the work function level.

The work function layer may be deposited over the gate dielectric layer 150 using an ALD process, a CVD process, a PVD process, an electroplating process, an electroless plating process, one or more other applicable processes, or a combination thereof. In some embodiments, the formation of the work function layer involves one or more patterning processes. As a result, the p-type work function layer and the n-type work function layer are selectively formed over respective regions.

In some embodiments, a barrier layer is formed before the work function layer to interface the gate dielectric layer 150 with the subsequently formed work function layer. The barrier layer may also be used to prevent diffusion between the gate dielectric layer 150 and the subsequently formed work function layer. The barrier layer may be made of or include a metal-containing material. The metal-containing material may include titanium nitride, tantalum nitride, one or more other suitable materials, or a combination thereof. The barrier layer may be deposited using an ALD process, a CVD process, a PVD process, an electroplating process, an electroless plating process, one or more other applicable processes, or a combination thereof.

In some embodiments, the conductive fillings of the metal gate electrodes 152 are made of or include a metal material. The metal material may include tungsten, aluminum, copper, cobalt, one or more other suitable materials, or a combination thereof. A conductive layer used for forming the conductive filling may be deposited over the work function layer using a CVD process, an ALD process, a PVD process, an electroplating process, an electroless plating process, a spin coating process, one or more other applicable processes, or a combination thereof.

In some embodiments, a blocking layer is formed over the work function layer before the formation of the conductive layer used for forming the conductive filling. The blocking layer may be used to prevent the subsequently formed conductive layer from diffusing or penetrating into the work function layer. The blocking layer may be made of or include tantalum nitride, titanium nitride, one or more other suitable materials, or a combination thereof. The blocking layer may be deposited using an ALD process, a PVD process, an electroplating process, an electroless plating process, one or more other applicable processes, or a combination thereof.

Afterwards, a planarization process is performed to remove the portions of the metal gate stack layers outside of the trenches 142, in accordance with some embodiments. As a result, the remaining portions of the metal gate stack layers form the metal gate stacks 156A and 156B, as shown in FIG. 3K.

In some embodiments, the conductive filling does not extend into the recesses 144 since the recesses 144 are small and have been filled with other elements such as the gate dielectric layer 150 and the work function layer. However, embodiments of the disclosure are not limited thereto. In some other embodiments, a portion of the conductive filling extends into the recesses 144, especially for the lower recesses 144 that may have larger space.

Afterwards, as shown in FIG. 2L, the dielectric layer 140 and the contact etch stop layer 139 are partially and sequentially removed to form contact openings 220A and 220B, in accordance with some embodiments. One or more photolithography processes and one or more etching processes may be used to form the contact openings 220A and 220B. The contact openings 220A and 220B exposes the epitaxial structures 138, as shown in FIG. 2L. In some embodiments, the epitaxial structure 138 exposes by the contact opening 220A functions as a drain structure, and the epitaxial structure exposed by the contact opening 220B functions as a source structure.

In some embodiments, the contact opening 220A further exposes the sacrificial structure 210, as shown in FIG. 2L. In some embodiments, the top surface of the sacrificial structure 210' is partially exposed by the contact opening 220A and is partially covered by the isolation structure 214. In some other embodiments, the top surface of the sacrificial structure 210' is completely exposed by the contact opening 220A.

As shown in FIG. 2M, conductive contacts 224A and 224B are formed over the epitaxial structures 138, in accordance with some embodiments. The conductive contacts 224A and 224B are used to provide electrical connection to the epitaxial structures 138. The conductive contacts 224A and 224B may be made of or include cobalt, tungsten, ruthenium, titanium, molybdenum, one or more other suitable materials, or a combination thereof.

In some embodiments, a barrier layer is formed between the dielectric layer 140 and the conductive contacts 224A and 224B. The barrier layer may be made of or include tantalum nitride, titanium nitride, one or more other suitable materials, or a combination thereof. The thickness of the barrier layer may be within a range from about 0.5 nm to about 3 nm.

Metal-semiconductor compound layers 222 may be formed between the conductive contacts 224A and 224B and the epitaxial structures 138. The metal-semiconductor compound layers 222 may be used to improve electrical connections between the epitaxial structures 138 and the conductive contacts 224A and 224B. The metal-semiconductor compound layers 222 may be made of or include ruthenium silicide, titanium silicide, nickel silicide, titanium nickel silicide, cobalt silicide, titanium silicon germanium, one or more other suitable materials, or a combination thereof. The thickness of the metal-semiconductor compound layers 222 may be within a range from about 1 nm to about 6 nm. The formation of the Metal-semiconductor compound layers 222 and the conductive contacts 224A and 224B may involve one or more patterning processes, one or more deposition processes, one or more thermal annealing processes, and one or more planarization processes.

In some embodiments, the conductive contact 224A extends across the topmost surface and the bottommost surface of the epitaxial structure 138 thereunder, as shown in FIG. 2M. In some embodiments, the conductive contact 224A further extends towards the sacrificial structure 210'. In some embodiments, the conductive contact 224A is in direct contact with the sacrificial structure 210'.

As shown in FIG. 2N, the conductive contacts 224A and 224B are recessed, in accordance with some embodiments. Afterwards, a protective element 226 is formed over the dielectric layer 140 and the conductive contacts 224A and 224B, as shown in FIG. 2N. Conductive vias 228A and 228B are then formed in the protective element 226 to form electrical connections to the conductive contacts 224A and 224B, respectively. The conductive vias 228A and 228B may be made of or include cobalt, tungsten, ruthenium, titanium, molybdenum, one or more other suitable materials, or a combination thereof.

In some embodiments, a barrier layer is formed between the protective element 226 and the conductive vias 228A and 228B. The barrier layer may be made of or include tantalum nitride, titanium nitride, one or more other suitable materials, or a combination thereof. The thickness of the barrier layer may be within a range from about 0.5 nm to about 3 nm.

Afterwards, a dielectric layer 230 and conductive lines 232 are formed. In some embodiments, a damascene process is used to form the conductive lines 232. Afterwards, multiple dielectric layers, multiple conductive lines including conductive lines 236, and multiple conductive vias are formed. The conductive lines 236 may be top metal layers and may function as conductive pads. As a result, an interconnection structure 234 is formed. A barrier layer may be formed between the conductive features (including the conductive vias and the conductive lines) and the dielectric layers surrounding the conductive features. The barrier layer may be made of or include tantalum nitride, titanium nitride, ruthenium cobalt, one or more other suitable materials, or a combination thereof. The barrier layer may be a single layer or include two or more sub-layers. The thickness of the barrier layer may be within a range from about 1 nm to about 10 nm.

As shown in FIG. 2O, a dielectric layer 238 is deposited over the interconnection structure 234, in accordance with some embodiments. The dielectric layer 238 is used to form bonding with a carrier substrate 240. A dielectric layer 242 may also be formed over the carrier substrate 240. The dielectric layers 238 and 242 may be made of or include silicon oxide or the like. The carrier substrate 240 may be a silicon wafer. In some embodiments, the carrier substrate 240 and the structure shown in FIG. 2N are bonded together through dielectric-to-dielectric bonding between the dielectric layers 238 and 242. The carrier substrate 240 may have a thickness that is within a range from about 700 μm to about 800 μm.

As shown in FIG. 2P, with the carrier substrate 240 as a support substrate, the semiconductor substrate 100 is thinned, in accordance with some embodiments. After the thinning of the semiconductor substrate 100, the sacrificial structure 210' and the spacer layer 208 are exposed. The carrier substrate 240 may be thinned using a planarization process. The planarization process may include a CMP process, a grinding process, an etching process, one or more other applicable processes, or a combination thereof.

As shown in FIG. 2Q, the sacrificial structure 210' is removed, in accordance with some embodiments. As a result, a trench 244 that exposes the conductive contact 224A is formed. The sacrificial structure 210' may be removed using one or more etching processes. For example, a wet etching process is used to remove the sacrificial structure 210'.

As shown in FIG. 2R, the lower portion of the spacer layer 208 is partially removed, in accordance with some embodiments. The corner of the spacer layer 208 thus becomes rounded, that facilitates the subsequent formation of a conductive structure in the trench 244. One or more etching processes may be used to achieve the corner etch of the spacer layer 208.

As shown in FIG. 2S, a conductive structure 246 is formed in the trench 244, in accordance with some embodiments. In some embodiments, the conductive structure 246 functions as a buried power rail (or a backside power rail). The conductive structure 246 may be made of or include copper, ruthenium, tungsten, aluminum, cobalt, titanium, tantalum, one or more other suitable materials, or a combination thereof. In some embodiments, the conductive structure 246 forms electrical connection to the epitaxial structure 138 through the conductive contact 224A. In some embodiments, the conductive structure 246 is in direct contact with the conductive contact 224A.

In some embodiments, the conductive structure 246 includes a barrier layer that interfaces the spacer layer 208 and the isolation structure 214. The barrier layer may be made of or include tantalum nitride, titanium nitride, one or more other suitable materials, or a combination thereof. The barrier layer may have a thickness that is within a range from about 0.5 nm to about 3 nm.

In some embodiments, one or more conductive material layers are deposited over the semiconductor substrate 100 to overfill the trench 244. The conductive material layers may be deposited using a CVD process, a PVD process, an ALD process, an electroplating process, an electrochemical plating process, one or more other applicable processes, or a combination thereof. Since the semiconductor substrate 100 has been thinned, the aspect ratio of the trench 244 is within an acceptable range. The filling of the conductive material layer may thus be performed well.

Afterwards, a planarization process is used to remove the portions of the conductive material layers outside of the trench 244. As a result, the remaining portion of the conductive material layers forms the conductive structure 246. The planarization process may include a CMP process, a grinding process, an etching process, one or more other applicable processes, or a combination thereof.

As illustrated in embodiments shown in FIGS. 2A-2S, the conductive structure 246 is formed in a self-aligned manner. In some embodiments, no photolithography process is needed for aligning the conductive structures 246 and the conductive contacts 224A. No overlay shift would occur between the conductive structure 246 and the conductive contact 224A. The conductive structures 246 are formed after the high temperature operations for transistors have been finished. The high temperature operations may include the formation processes of the epitaxial structures 138, the metal gate stacks 156A and 156B, and the metal-semiconductor compound layers 222. The quality and stability of the conductive structure 246 are prevented from being negatively affected by the high temperature operations. The reliability and performance of the semiconductor device structure are greatly improved.

The conductive structure 246 may have a height H that is within a range from about 50 nm to about 300 nm. The conductive structure 246 may have a width W that is within a range from about 20 nm to about 40 nm. The conductive structure 246 may have a length that is within a range from about 10 nm to about 1000 nm. After the formation of the conductive structure 246, the semiconductor substrate 100 that remains may have a thickness T that is within a range from about 50 nm to about 200 nm.

As shown in FIG. 2T, a dielectric layer 248 is then deposited to cover the semiconductor substrate 100 and the conductive structure 246, in accordance with some embodiments. The material and formation method of the dielectric layer 248 may be the same as or similar to those of the dielectric layer 140.

Afterwards, a conductive feature 250 is formed in the dielectric layer 248, as shown in FIG. 2T in accordance with some embodiments. The conductive feature 250 is electrically connected to the conductive structure 246. The conductive feature 250 may be made of or include ruthenium, copper, tungsten, aluminum, cobalt, titanium, tantalum, molybdenum, one or more other suitable materials, or a combination thereof.

A barrier layer may be formed between the conductive feature 250 and the dielectric layer 248. The barrier layer may be made of or include tantalum nitride, titanium nitride, one or more other suitable materials, or a combination thereof.

In some embodiments, one or more photolithography processes and one or more etching processes are used to form the opening used for containing the conductive feature 250. Afterwards, one or more conductive layers are deposited to fill the opening. A planarization process is then performed to remove the portions of the conductive layers outside of the opening. As a result, the remaining portions of the conductive layers form the conductive feature 250.

As shown in FIG. 2T, one or more interconnection structure such as the interconnection structures 252 and 256 are formed. Conductive features 254 may be used to form electrical connection between the conductive feature 250 and conductive pads 258. The conductive pads 258 may have a thickness that is within a range from about 1300 nm to about 4000 nm. The materials and formation method of the interconnection structures 252 and 256 may be the same as or similar to those of the interconnection structure 234.

Afterwards, a protective layer 260 and conductive bumps 262 are formed, as shown in FIG. 2T in accordance with some embodiments. The protective layer 260 may be made of or include a nitride material. The conductive bumps 262 may be made of or include aluminum, titanium, copper, chromium, tin-containing solder material, one or more other suitable materials, or a combination thereof. In some embodiments, the carrier substrate 240 is removed before further packaging the structure shown in FIG. 2T.

Many variations and/or modifications can be made to embodiments of the disclosure. The semiconductor nanostructures may have many applicable profiles. The semiconductor nanostructures may include nanosheets, nanowires, or other suitable nanostructures.

As shown in FIG. 3K, the sheet number of the GAA device is four. However, embodiments of the disclosure are not limited thereto. Many variations and/or modifications can be made to embodiments of the disclosure. In some other embodiments, the sheet number of the GAA device may be 2, 3, 5, 6, or other suitable number.

Some embodiments relate to the GAA devices. However, embodiments of the disclosure are not limited thereto. Many variations and/or modifications can be made to embodiments of the disclosure. Some other embodiments may relate to planar transistor devices, FinFET devices, GAA devices including forksheets, one or more other applicable devices, or a combination thereof.

Embodiments of the disclosure form a semiconductor device structure with a backside conductive structure that may function as a power rail. A sacrificial structure is formed in a semiconductor substrate. The sacrificial structure is beside a fin structure and defines the position where the backside conductive structure will be formed. After the formation of the transistors, the semiconductor substrate is thinned to expose the sacrificial structure. Then, the sacrificial structure is replaced with a conductive structure that may function as a backside power rail. The conductive structure is self-aligned formed after the high temperature operations have been performed. No overlay shift and or any high temperature induced damage of the conductive structure would occur. The reliability and quality of the conductive structure are significantly improved.

In accordance with some embodiments, a method for forming a semiconductor device structure is provided. The method includes forming a first fin structure and a second fin structure over a substrate. The method also includes partially removing the substrate to form a trench between the first fin structure and the second fin structure and forming a sacrificial structure to fill the trench. The method further includes forming an epitaxial structure on the first fin structure and forming a conductive contact over the epitaxial structure and the sacrificial structure. In addition, the method includes replacing the sacrificial structure with a conductive structure.

In accordance with some embodiments, a method for forming a semiconductor device structure is provided. The method includes forming a fin structure over a substrate and forming a sacrificial structure beside the fin structure. A bottom surface of the fin structure is vertically between a top of the sacrificial structure and a bottom of the sacrificial structure. The method also includes forming an epitaxial structure on the fin structure and forming a conductive contact partially or completely covering the epitaxial structure and the sacrificial structure. The method further includes removing the sacrificial structure to form a trench exposing the conductive contact. In addition, the method includes forming a conductive structure in the trench.

In accordance with some embodiments, a semiconductor device structure is provided. The semiconductor device structure includes a semiconductor fin over a substrate and an epitaxial structure on the semiconductor fin. The semiconductor device structure also includes a conductive contact electrically connected to the epitaxial structure. The semiconductor device structure further includes a conductive structure extending from a bottom surface of the substrate towards the conductive contact. The conductive structure is electrically connected to the conductive contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:

forming a first fin structure and a second fin structure over a substrate;

partially removing the substrate to form a trench between the first fin structure and the second fin structure;

forming a sacrificial structure to fill the trench;

forming an epitaxial structure on the first fin structure;

forming a conductive contact over the epitaxial structure and the sacrificial structure, wherein an upper portion of the sacrificial structure interfacing the conductive contact is made of a dielectric material, wherein the conductive contact is formed after the epitaxial structure is formed;

exposing a bottom of the sacrificial structure;

removing the sacrificial structure from the bottom of the sacrificial structure to form an opening exposing the conductive contact; and forming a conductive structure filling the opening and reaching the conductive contact, wherein a top surface of the conductive structure is vertically positioned between a bottom of the first fin structure and an interface between the first fin structure and the epitaxial structure, and the conductive structure is formed after the epitaxial structure is formed.

2. The method for forming a semiconductor device structure as claimed in claim 1, further comprising:

thinning the substrate from a lower surface of the substrate so that the bottom of the sacrificial structure is exposed.

3. The method for forming a semiconductor device structure as claimed in claim 2, further comprising:

forming an interconnection structure over the conductive contact; and bonding a carrier substrate to the interconnection structure before the substrate is thinned.

4. The method for forming a semiconductor device structure as claimed in claim 1, further comprising:

forming a first spacer layer along sidewalls of the first fin structure and the second fin structure before the trench is formed; and forming a second spacer layer along sidewalls of the trench before the sacrificial structure is formed.

5. The method for forming a semiconductor device structure as claimed in claim 1, further comprising:

forming an isolation structure over the sacrificial structure, wherein the isolation structure surrounds lower portions of the first fin structure and the second fin structure.

6. The method for forming a semiconductor device structure as claimed in claim 1, further comprising:

recessing the first fin structure before the epitaxial structure is formed.

7. The method for forming a semiconductor device structure as claimed in claim 1, wherein the conductive structure is formed to be in direct contact with a bottom of the conductive contact.

8. The method for forming a semiconductor device structure as claimed in claim 5, wherein the opening partially exposes the isolation structure.

9. The method for forming a semiconductor device structure as claimed in claim 1, wherein the sacrificial structure comprises silicon oxide, aluminum nitride, or a combination thereof.

10. The method for forming a semiconductor device structure as claimed in claim 1, wherein:

the conductive contact has a bottommost surface, a first sidewall, and a second sidewall, the second sidewall is opposite the first sidewall, the bottommost surface adjoins the first sidewall and the second sidewall, the conductive structure has a third sidewall substantially aligned with the first sidewall of the conductive contact, and the conductive structure laterally extends across the second sidewall of the conductive contact.

11. A method for forming a semiconductor device structure, comprising:

forming a fin structure over a substrate;

forming a sacrificial structure beside the fin structure, wherein a bottom surface of the fin structure is vertically between a top of the sacrificial structure and a bottom of the sacrificial structure;

forming an epitaxial structure on the fin structure, wherein the top of the sacrificial structure is vertically between the bottom surface of the fin structure and a bottom of the epitaxial structure;

forming a dielectric layer over the epitaxial structure and the sacrificial structure;

partially removing the dielectric layer to form a contact opening, wherein the contact opening exposes an upper slanted surface of the epitaxial structure, a lower slanted surface of the epitaxial structure, and the sacrificial structure;

forming a conductive contact at least partially covering the epitaxial structure and the sacrificial structure, wherein the conductive contact is formed after the epitaxial structure is formed, the conductive contact has a bottommost surface, a first sidewall, and a second sidewall opposite to the first sidewall, and the bottommost surface adjoins the first sidewall and the second sidewall;

exposing a bottom of the sacrificial structure after the conductive contact is formed;

removing the sacrificial structure from the bottom of the sacrificial structure to form a trench exposing the conductive contact; and forming a conductive structure in the trench, wherein the conductive structure is formed after the epitaxial structure is formed, and the conductive structure has a third sidewall substantially aligned with the first sidewall of the conductive contact, and the conductive structure laterally extends across the second sidewall of the conductive contact.

12. The method for forming a semiconductor device structure as claimed in claim 11, further comprising:

thinning the substrate from a lower surface of the substrate so that the bottom of the sacrificial structure is exposed.

13. The method for forming a semiconductor device structure as claimed in claim 11, further comprising:

forming a spacer layer before the sacrificial structure is formed, wherein the spacer layer extends along sidewalls and a bottom of the sacrificial structure after the sacrificial structure is formed.

14. The method for forming a semiconductor device structure as claimed in claim 13, further comprising:

partially removing a lower portion of the spacer layer after the trench is formed and before the conductive structure is formed.

15. The method for forming a semiconductor device structure as claimed in claim 11, wherein the sacrificial structure comprises an oxide material, a nitride material, or a combination thereof.

16. A semiconductor device structure, comprising:

a semiconductor fin over a substrate;

an epitaxial structure on the semiconductor fin;

a conductive contact electrically connected to the epitaxial structure, wherein the conductive contact has a bottommost surface, a first sidewall, and a second sidewall opposite to the first sidewall, and the bottommost surface adjoins the first sidewall and the second sidewall;

an isolation structure laterally surrounding the semiconductor fin, wherein the isolation structure has a portion positioned beside the conductive contact; and a conductive structure continuously extending from a bottom surface of the substrate towards the conductive contact and reaching the conductive contact and an interface between the conductive contact and the portion of the isolation structure, wherein the conductive structure is electrically connected to the conductive contact, and a topmost surface of the conductive structure is vertically positioned between a bottom of the first fin structure and an interface between the first fin structure and the epitaxial structure, wherein a portion of the conductive contact is vertically between the epitaxial structure and a top of the conductive structure and laterally between the semiconductor fin and an outermost edge of the epitaxial structure, wherein the conductive structure has a third sidewall and a fourth sidewall opposite to the third sidewall, the third sidewall is substantially aligned with the first sidewall of the conductive contact, and the second sidewall of the conductive contact is laterally between the third sidewall and the fourth sidewall of the conductive structure.

17. The semiconductor device structure as claimed in claim 16, further comprising a dielectric spacer layer between the conductive contact and the substrate.

18. The semiconductor device structure as claimed in claim 16, wherein the conductive contact extends across a topmost surface of the epitaxial structure and a bottommost surface of the epitaxial structure.

19. The semiconductor device structure as claimed in claim 16, further comprising:

a support element between the epitaxial structure and the conductive contact, wherein the conductive contact extends along a top of the support element and a sidewall of the support element.

20. The semiconductor device structure as claimed in claim 19, further comprising:

a metal-semiconductor compound layer between the epitaxial structure and the conductive contact, wherein the metal-semiconductor compound layer and the support element together surround a corner region, and the conductive contact fills the corner region.

* * * * *